US010176147B2

(12) United States Patent
Samadi et al.

(10) Patent No.: US 10,176,147 B2
(45) Date of Patent: Jan. 8, 2019

(54) MULTI-PROCESSOR CORE THREE-DIMENSIONAL (3D) INTEGRATED CIRCUITS (ICS) (3DICS), AND RELATED METHODS

(71) Applicant: QUALCOMM Incorporated, San Diego, CA (US)

(72) Inventors: Kambiz Samadi, San Diego, CA (US); Amin Ansari, San Diego, CA (US); Yang Du, Carlsbad, CA (US)

(73) Assignee: QUALCOMM Incorporated, San Diego, CA (US)

(*) Notice: Subject to any disclaimer, the term of this patent is extended or adjusted under 35 U.S.C. 154(b) by 45 days.

(21) Appl. No.: 15/452,299

(22) Filed: Mar. 7, 2017

(65) Prior Publication Data

US 2018/0260360 A1 Sep. 13, 2018

(51) Int. Cl.
*G06F 9/30* (2018.01)
*G06F 15/80* (2006.01)
(Continued)

(52) U.S. Cl.
CPC ............ *G06F 15/80* (2013.01); *G06F 9/3016* (2013.01); *G06F 9/3802* (2013.01); *G06F 9/384* (2013.01);
(Continued)

(58) Field of Classification Search
CPC ...... G06F 9/3016; G06F 9/3802; G06F 9/384; G06F 9/3867; G06F 9/3891;
(Continued)

(56) References Cited

U.S. PATENT DOCUMENTS 5,943,254 A * 8/1999 Bakeman, Jr. ...... H01L 23/5286
257/E23.153
6,212,604 B1 4/2001 Tremblay
(Continued)

OTHER PUBLICATIONS

Borodin, Demid et al., "Functional Unit Sharing Between Stacked Processors in 3D Integrated Systems," 2011 International Conference on Embedded Computer Systems (SAMOS), IEEE, Jul. 18, 2011, pp. 311-317.
(Continued)

*Primary Examiner* — Daniel H Pan
(74) *Attorney, Agent, or Firm* — Withrow & Terranova, PLLC

(57) ABSTRACT

Multi-processor core three-dimensional (3D) integrated circuits (ICs) (3DICs) and related methods are disclosed. In aspects disclosed herein, ICs are provided that include a central processing unit (CPU) having multiple processor cores ("cores") to improve performance. To further improve CPU performance, the multiple cores can also be designed to communicate with each other to offload workloads and/or share resources for parallel processing, but at a communication overhead associated with passing data through interconnects which have an associated latency. To mitigate this communication overhead inefficiency, aspects disclosed herein provide the CPU with its multiple cores in a 3DIC. Because 3DICs can overlap different IC tiers and/or align similar components in the same IC tier, the cores can be designed and located between or within different IC tiers in a 3DIC to reduce communication distance associated with processor core communication to share workload and/or resources, thus improving performance of the multi-processor CPU design.

37 Claims, 18 Drawing Sheets

(51) Int. Cl.
  *H01L 21/00* (2006.01)
  *H01L 25/00* (2006.01)
  *H01L 27/00* (2006.01)
  *G06F 9/38* (2018.01)
  *G06F 12/0875* (2016.01)
  *G06F 15/76* (2006.01)
  *H01L 21/822* (2006.01)
  *H01L 25/065* (2006.01)
  *H01L 27/06* (2006.01)

(52) U.S. Cl.
  CPC ........ *G06F 9/3867* (2013.01); *G06F 12/0875* (2013.01); *G06F 15/76* (2013.01); *H01L 21/8221* (2013.01); *H01L 25/0657* (2013.01); *H01L 27/0688* (2013.01); *G06F 9/3012* (2013.01); *G06F 9/30145* (2013.01); *G06F 9/382* (2013.01); *G06F 15/803* (2013.01); *G06F 2212/452* (2013.01)

(58) Field of Classification Search
  CPC .... G06F 9/30145; G06F 9/3012; G06F 9/382; G06F 15/161; G06F 15/163; G06F 15/17381; G06F 15/17387; G06F 15/17393; G06F 15/80; G06F 15/803; G06F 15/76; G06F 2015/763; G06F 2015/765; G06F 2015/766; G06F 2015/768; G06F 12/0875; G06F 2212/452; H01L 27/0688; H01L 25/0657; H01L 21/8221

USPC ................ 712/11–19, 32–35, 205–207, 213; 711/125, 132
  See application file for complete search history.

(56) References Cited

U.S. PATENT DOCUMENTS

| | | | |
|---|---|---|---|
| 8,417,917 | B2 | 4/2013 | Emma et al. |
| 8,476,771 | B2 | 7/2013 | Scheuermann et al. |
| 9,171,608 | B2 | 10/2015 | Xie et al. |
| 9,418,985 | B2 | 8/2016 | Du |
| 2011/0161586 | A1 | 6/2011 | Potkonjak et al. |
| 2014/0327630 | A1* | 11/2014 | Burr .................... G06F 3/0488 345/173 |
| 2015/0022262 | A1* | 1/2015 | Du ...................... H01L 21/8221 327/565 |
| 2015/0370754 | A1* | 12/2015 | Morimoto ........... G06F 12/0893 361/679.31 |
| 2016/0019063 | A1* | 1/2016 | Rappoport ............ G06F 9/3009 712/212 |
| 2016/0217087 | A1 | 7/2016 | Lim et al. |

OTHER PUBLICATIONS

Rotenberg, Eric et al., "Rationale for a 3D Heterogeneous Multi-Core Processor," 2013 IEEE 31st International Conference on Computer Design (ICCD), IEEE, Oct. 6, 2013, pp. 154-168.
International Search Report and Written Opinion for PCT/US2018/012077, dated Jun. 6, 2018, 28 pages.

* cited by examiner

MULTI-PROCESSOR CORE THREE-DIMENSIONAL (3D) INTEGRATED CIRCUITS (ICS) (3DICS), AND RELATED METHODS

BACKGROUND

I. Field of the Disclosure

The technology of the disclosure relates generally to central processing units (CPUs) that can be provided as microprocessors, and which include one or more processor cores ("cores") for executing instructions.

II. Background

A central processing unit (CPU) is capable of performing computational tasks in a wide variety of applications. A typical CPU is provided in the form of a microprocessor on a single chip. The CPU includes one or more processor cores, also referred to as processors or cores, that are each capable of executing software instructions. A CPU can have a single core or multiple cores. The software instructions provide instructions to a processor core to fetch data from a location in memory, perform one or more logic or computational operations using the fetched data, and generate a result. The result may then be stored in memory. As examples, this memory can be a cache local to a processor core, a shared local cache among the multiple processor cores, or main memory of the CPU.

It may be desired to assess the performance of a CPU to evaluate a microprocessor architecture design. In this regard, a benchmark computer program or set of programs containing instructions can be developed that are executed on a CPU in order to assess the relative performance of an object. Benchmarks are particularly important in CPU design, because the benchmark results provide processor architects the ability to measure and make tradeoffs in micro-architectural decisions. Any given use case or benchmark exhibits different execution phases in a CPU in terms of instructions per cycle (IPC), power consumption, instruction-level parallelism (ILP), branch prediction accuracy, cache misses, etc. This means there is no optimal, statically designed core for a given benchmark. In addition, the sets of workloads are not exactly known when designing a CPU chip. Thus, conflicting demands between performance and power efficiency must be met.

SUMMARY OF THE DISCLOSURE

Aspects disclosed herein include multi-processor core three-dimensional (3D) integrated circuits (ICs) (3DICs), and related methods. In aspects disclosed herein, ICs are provided that include a central processing unit (CPU) having multiple processor cores ("cores") to improve performance. To further improve CPU performance, the multiple cores can also be designed to communicate with each other to offload workloads and/or share resources for parallel processing, but at a communication overhead associated with passing data through interconnects which have an associated latency. Further, to meet conflicting demands between performance and power efficiency in a CPU design, heterogeneous chip-multi-processors have been designed. Heterogeneous chip-multi-processors include different types of cores designed to exhibit different power and performance characteristics to mitigate conflicting demands between performance and power efficiency. In this manner, a heterogeneous chip-multi-processor can move different threads between different cores to optimize performance. Cores may be organized into groups known as "clusters." Each cluster may include one or more cores, and may also include shared cluster resources that can be accessed by any core within the cluster. For example, shared cluster resources may include an execution pipeline that each of the hardware threads of the cluster may use on a rotating basis. Multiple clusters may be further organized into heterogeneous "clustered processor cores." Each clustered processor core may include shared hardware resources that may be utilized by the multiple clusters. The shared hardware resources may include one or more execution units (e.g., floating point units and/or arithmetic logic units) and/or caches (e.g., data caches), as non-limiting examples.

However, moving threads between different clustered cores incurs communication overhead that puts an upper bound on how many power and/or performance improvements can be achieved by moving a thread to an optimal core for a particular program phase. For example, communication overhead is incurred by moving the architectural state (i.e., program counter (PC), architectural registers, and memory state) from one core to a different core. Further, each cluster has distinct local caches to maintain latency and efficiency, and on migration, these caches must be migrated or flushed. Passing data across distances on the chip limits efficiency between heterogeneous core clusters.

To mitigate this communication overhead inefficiency, aspects disclosed herein provide the CPU with multiple cores in a 3DIC. A 3DIC is a chip in which two or more semiconducting layers or IC tiers of active electronic components are integrated both vertically and horizontally into a single circuit to be provided in an integrated semiconducting die. To provide electrical inter-tier interconnections between circuits disposed in different IC tiers in the 3DIC, conductive inter-tier vertical interconnect accesses (vias) (ITVs) (e.g., through-silicon-vias (TSVs), face-to-face interconnect vias, metal pads) are fabricated in the 3DIC to electrically couple electrical components between different IC tiers. Thus, because 3DICs can overlap different IC tiers and/or align similar components in the same IC tier, the cores can be designed and located between or within different IC tiers in a 3DIC to reduce communication distance associated with processor core communication to share workload and/or resources, thus improving performance of the multi-processor CPU design.

In certain aspects disclosed herein, a multi-processor core 3DIC can be provided in which processing circuits of each core are fully contained on an IC tier of the 3DIC. The cores can be configured to, for example, communicate between their different IC tiers with each other through inter-tier interconnections to offload workloads and/or share resources. In other aspects disclosed herein, a multi-processor core 3DIC can be provided in which components of each core are spilt between at least two IC tiers of the 3DIC. For example, the cores can be configured to communicate between their different IC tiers with each other through inter-tier interconnections to perform operations within a single core. As another example, the cores can be configured to communicate with other processing circuits of other cores within the same IC tier to offload workloads and/or share resources.

Different CPU designs for multiple processor cores communicating with each other to offload workloads and/or resources for parallel processing can be realized by a multi-processor core 3DIC. For example, the 3DIC may include multiple cores that are capable of moving different threads between different cores to optimize performance. For example, the processor cores may be heterogeneous cores that are designed to exhibit different power and performance characteristics to mitigate conflicting demands between performance and power efficiency. The cores may be organized into groups known as "clusters," and include shared cluster resources that can be accessed by any core within the cluster. As an example, providing the multiple cores in a 3DIC can allow more frequent, lower overhead switching of processes between different cores to more easily be realized to meet performance requirements and improve energy efficiency. As another example, the 3DIC may include multiple cores that are capable of being "fused" together where multiple processor cores can be combined to form larger, more complex cores according to performance and/or power demands. In each of these examples, communication between cores is performed where providing the multiple cores in a CPU in a 3DIC can be utilized to overlap different IC tiers and/or align similar components in the same IC tier for efficient core communication.

In this regard, in one exemplary aspect, a 3DIC is provided. The 3DIC comprises a first IC tier comprising a first processor core comprising a plurality of first processing circuits. The plurality of first processing circuits also comprises a first front end processing circuit comprising a first instruction fetch circuit coupled to a first instruction cache memory. The plurality of first processing circuits also comprises a first back end processing circuit comprising a first execution circuit coupled to the first front end processing circuit. The 3DIC also comprises a second IC tier different from the first IC tier. The second IC tier comprises a second processor core comprising a plurality of second processing circuits. The plurality of second processing circuits also comprises a second front end processing circuit comprising a second instruction fetch circuit coupled to a second instruction cache memory. The plurality of second processing circuits also comprises a second back end processing circuit comprising a second execution circuit coupled to the second front end processing circuit and configured to execute the second instructions. The 3DIC also comprises at least one first inter-tier interconnect coupling a first processing circuit of the plurality of first processing circuits in the first processor core in the first IC tier, to the second instruction cache memory in the second IC tier.

In another exemplary aspect, a method of communicating information between processor cores in a 3DIC is provided. The method comprises fetching a first instruction from a first instruction cache memory in a first front end processing circuit in a first processor core in a first IC tier. The method also comprises decoding the first instruction in the first processor core into a first decoded instruction. The method also comprises executing the first decoded instruction in a first back end processing circuit in the first processor core. The method also comprises fetching a second instruction from the first instruction cache memory, into a second processor core through at least one first inter-tier interconnect coupling the second processor core in a second IC tier to the first instruction cache memory in the first IC tier. The method also comprises decoding the second instruction in a second front end processing circuit in the second processor core into a second decoded instruction. The method also comprises executing the second decoded instruction in a second back end processing circuit in the second processor core.

In another exemplary aspect, a 3DIC is provided. The 3DIC comprises a first IC tier comprising a first processor core comprising a plurality of first processing circuits. The plurality of first processing circuits comprises a first architectural state circuit comprising a first program counter circuit and a first register file circuit comprising a plurality of first registers. The plurality of first processing circuits also comprises a first front end processing circuit comprising a first instruction fetch circuit configured to fetch first instructions from a first instruction memory. The plurality of first processing circuits also comprise a first back end processing circuit comprising a first execution circuit coupled to the first front end processing circuit and configured to execute the first instructions. The 3DIC also comprises a second IC tier different from the first IC tier. The second IC tier comprises a second processor core comprising a plurality of second processing circuits. The plurality of second processing circuits comprises a second architectural state circuit comprising a second program counter circuit and a second register file circuit comprising a plurality of second registers. The plurality of second processing circuits also comprises a second front end processing circuit comprising a second instruction fetch circuit configured to fetch second instructions from a second instruction memory. The plurality of second processing circuits also comprises a first back end processing circuit comprising a second execution circuit coupled to the second front end processing circuit and configured to execute the second instructions. The 3DIC also comprises at least one first inter-tier interconnect coupling a first processing circuit of the plurality of first processing circuits in the first processor core in the first IC tier, to the second architectural state circuit in the second IC tier.

In another exemplary aspect, a method of communicating information between processor cores in a 3DIC is provided. The method comprises fetching a first instruction associated with a first process thread into a first front end processing circuit in a first processor core in a first IC tier. The method also comprises decoding the first instruction in the first processor core into a first decoded instruction. The method also comprises executing the first decoded instruction in a first back end processing circuit in the first processor core. The method also comprises assigning the first process thread from the first processor core to a second processor core in a second IC tier different from the first IC tier. In response to assigning the first process thread from the first processor core to the second processor core, the method also comprises communicating a current program counter for the first process thread in a first program counter circuit in the first processor core, as a current program counter in a second program counter circuit in the second processor core through at least one first inter-tier interconnect coupling the first program counter circuit in the first IC tier to the second program counter circuit in the second IC tier. In response to assigning the first process thread from the first processor core to the second processor core, the method also comprises communicating a current register file state for the first process thread in a first register file circuit in the first processor core, as a current register file state in a second register file circuit in the second processor core through at least one second inter-tier interconnect coupling the first register file circuit in the first IC tier to the second register file circuit in the second IC tier. In response to assigning the first process thread from the first processor core to the second processor core, the method also comprises, fetching a second instruction associated with the first process thread, into the second processor core, decoding the second instruction in a second front end processing circuit in the second processor core into a second decoded instruction, executing the second decoded instruction in a second back end processing circuit in the second processor core, updating the current program counter in the second program counter circuit in the second processor core, and updating the current register file state in the second register file circuit in the second processor core.

In another exemplary aspect, a 3DIC is provided. The 3DIC comprises a first processor core comprising a plurality of first processing circuits configured to process first instructions. The plurality of first processing circuits is disposed over at least two IC tiers. The plurality of first processing circuits comprises a first front end processing circuit configured to decode the first instructions into first decoded instructions. The plurality of first processing circuits also comprises a first back end processing circuit coupled to the first front end processing circuit and configured to execute the first decoded instructions. The 3DIC also comprises a second processor core comprising a plurality of second processing circuits configured to process second instructions. The plurality of second processing circuits is disposed over the at least two IC tiers. The plurality of second processing circuits comprises a second front end processing circuit configured to decode the second instructions into second decoded instructions, and a second back end processing circuit coupled to the second front end processing circuit and configured to execute the second decoded instructions. The 3DIC also comprises at least one first inter-tier interconnect coupling at least one first processing circuit of the plurality of first processing circuits in a first IC tier of the at least two IC tiers and at least one second processing circuit of the plurality of second processing circuits in a second IC tier of the at least two IC tiers.

In another exemplary aspect, a method of communicating information between processor cores in 3DIC. The method comprises fetching a first instruction from a first instruction cache memory in a first front end processing circuit in a first processor core in a first IC tier, the first processor core disposed over at least two IC tiers. The method also comprises decoding the first instruction in the first processor core into a first decoded instruction. The method also comprises executing the first decoded instruction in a first back end processing circuit in the first processor core. The method comprises fetching a second instruction from the first instruction cache memory, into a second processor core disposed over the at least two IC tiers, through at least one first interconnect coupling the second processor core to the first processor core. The method comprises decoding the second instruction in a second front end processing circuit in the second processor core into a second decoded instruction. The method comprises executing the second decoded instruction in a second back end processing circuit in the second processor core.

In another exemplary aspect, a method of communicating information between processor cores in a 3DIC. The method comprises fetching a first instruction associated with a first process thread into a first front end processing circuit in a first processor core disposed over at least two IC tiers. The method also comprises decoding the first instruction in the first processor core into a first decoded instruction. The method also comprises executing the first decoded instruction in a first back end processing circuit in the first processor core. The method also comprises assigning the first process thread from the first processor core to a second processor core disposed over the at least two IC tiers. The method also comprises in response to assigning the first process thread from the first processor core to the second processor core, communicating a current program counter for the first process thread in a first program counter circuit in the first processor core, as a current program counter in a second program counter circuit in the second processor core through at least one first interconnect coupling the first program counter circuit to the second program counter circuit, communicating a current register file state for the first process thread in a first register file circuit in the first processor core, as a current register file state in a second register file circuit in the second processor core through at least one second interconnect coupling the first register file circuit to the second register file circuit, fetching a second instruction associated with the first process thread, into the second processor core, decoding the second instruction in a second front end processing circuit in the second processor core into a second decoded instruction, executing the second decoded instruction in a second back end processing circuit in the second processor core, updating the current program counter in the second program counter circuit in the second processor core, updating the current register file state in the second register file circuit in the second processor core.

DETAILED DESCRIPTION

Figure 1:
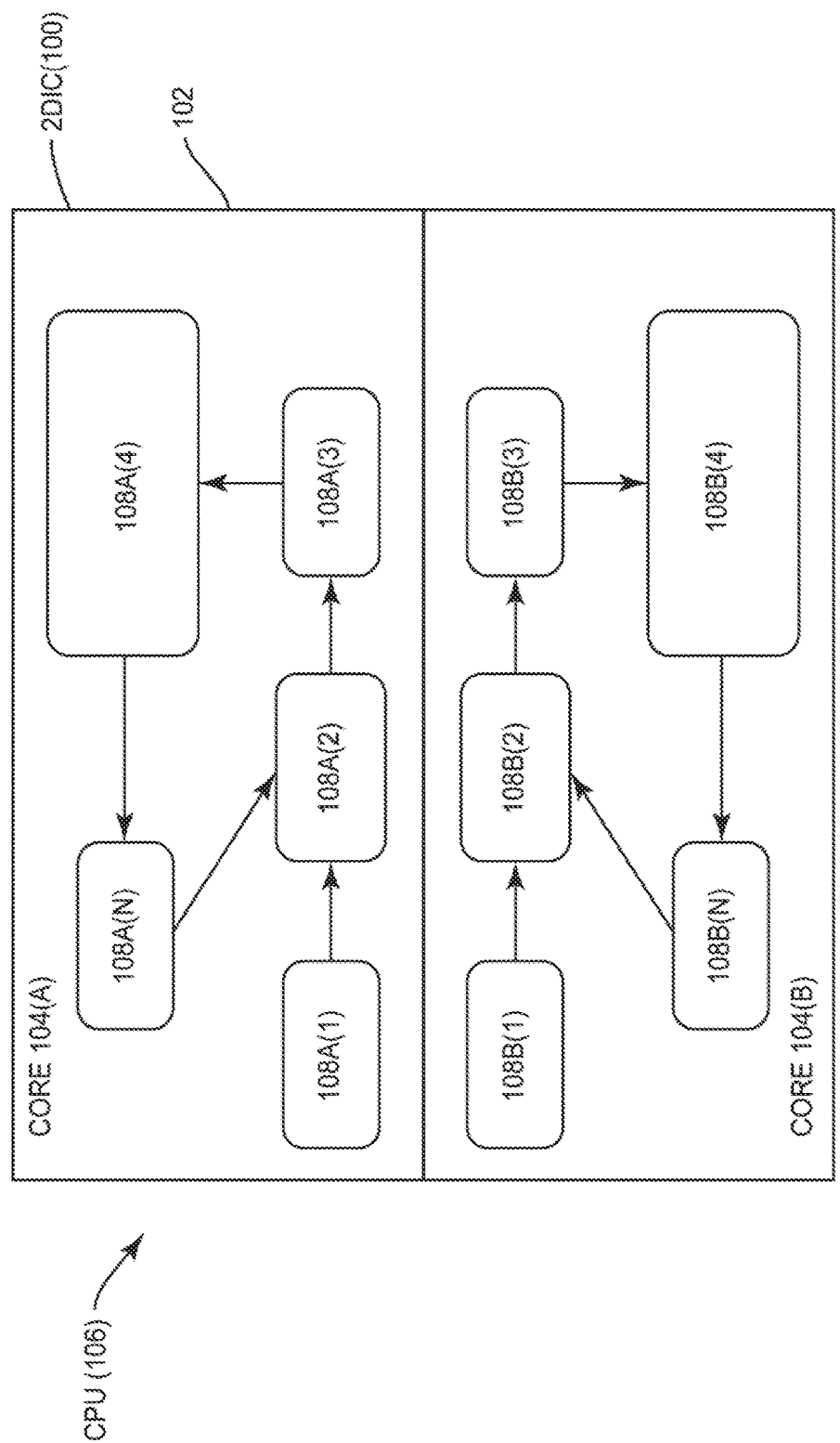
FIG. 1 is a block diagram of a multi-processor core two-dimensional (2D) integrated circuit (IC) (2DIC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-processor core three-dimensional (3D) integrated circuits (ICs) (3DICs), and related methods. In aspects disclosed herein, ICs are provided that include a central processing unit (CPU) having multiple processor cores ("cores") to improve performance. To further improve CPU performance, the multiple cores can also be designed to communicate with each other to offload workloads and/or share resources for parallel processing, but at a communication overhead associated with passing data through interconnects which have an associated latency. To mitigate this communication overhead inefficiency, aspects disclosed herein provide the CPU with multiple cores in a 3DIC. A 3DIC is a chip in which two or more semiconducting layers or IC tiers of active electronic components are integrated both vertically and horizontally into a single circuit to be provided in an integrated semiconducting die. To provide electrical inter-tier interconnections between circuits disposed in different IC tiers in the 3DIC, conductive inter-tier vertical interconnect accesses (vias) (ITVs) (e.g., through-silicon-vias (TSVs), face-to-face interconnect vias, metal pads) are fabricated in the 3DIC to electrically couple electrical components between different IC tiers. Thus, because 3DICs can overlap different IC tiers and/or align similar components in the same IC tier, the cores can be designed and located between or within different IC tiers in a 3DIC to reduce communication distance associated with processor core communication to share workload and/or resources, thus improving performance of the multi-processor CPU design.

Figure 2:
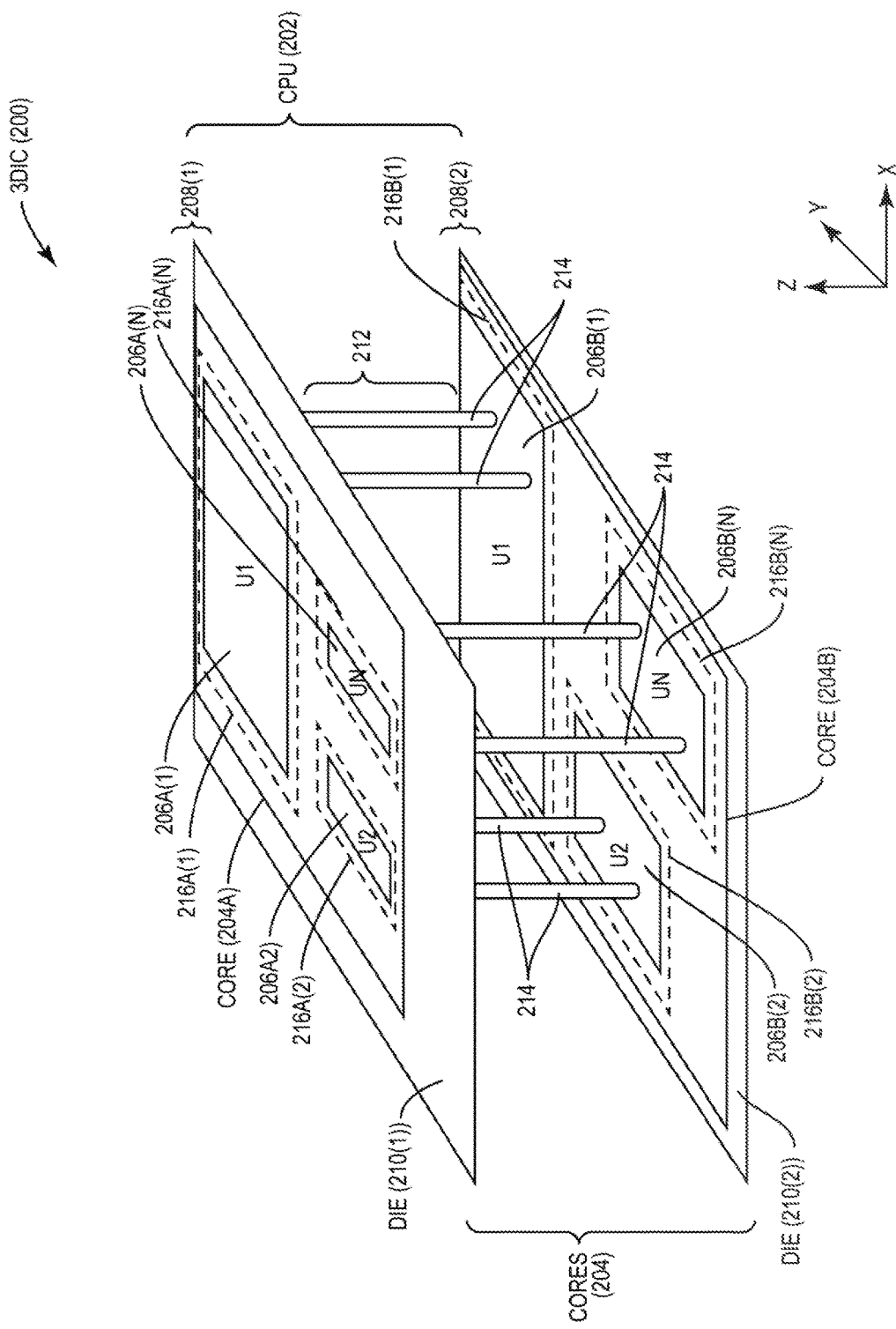
FIG. 2 is an exemplary multi-processor core three-dimensional (3D) IC (3DIC), wherein each processor core ("core") is self-contained on a single IC tier in the 3DIC and configured to communicate with another core in a different IC tier to offload workload and/or share resources for improved CPU performance.

Before discussing examples of multi-processor core 3DICs starting at FIG. 2, FIG. 1 illustrating a block diagram of a multi-processor core two-dimensional (2D) integrated circuit (IC) (2DIC) 100 is first discussed. As shown in FIG. 1, the 2DIC 100 is provided in the form of a chip 102. A 2DIC is an IC that includes circuits and related components in one die. A single semiconducting or active layer is provided for forming active devices. A number of metal layers is disposed above the semiconducting layer to provide interconnections with the active devices formed in the semiconducting layer.

The 2DIC 100 in FIG. 1 includes two processor cores 104A, 104B in this example as part of a CPU 106. The processor cores 104A, 104B are also referred to as cores 104A, 104B. Each of the cores 104A, 104B includes various processing circuits 108A(1)-108A(N), 108B(1)-108B(N) in this example that perform various tasks in the respective cores 104A, 104B. For example, these processing circuits 108A(1)-108A(N), 108B(1)-108B(N) may include memory structures, such as instruction cache memory for caching instructions to be executed, physical register files for storing physical register information, and a register map table to map logical registers to physical registers as examples. These processing circuits 108A(1)-108A(N), 108B(1)-108B(N) may include front end processing circuits and back end processing circuits as part of one or more instruction pipelines. Examples of front end processing circuits include, but are not limited to, instruction fetching circuits configured to fetch instructions, instruction decode circuits configured to decode instructions, and branch prediction circuits configured to predict branches for conditional or branch instructions. Examples of back end processing circuits include, but are not limited to, execution circuits configured to execute instructions, and rename circuits. If the cores 104A, 104B are out-of-order processors (OoP) configured to execute instructions out of order for throughput efficiency purposes, the back end processing circuits may also include rename circuits configured to determine if any register names in the decoded instructions need to be renamed to break any register dependencies, allocation circuits for reading physical registers containing source operands from a physical register file to determine if the producing instruction responsible for producing the value has been executed, or issue circuits for dispatching instructions for out-of-order execution to execution circuits.

To meet the conflicting demands between performance and power efficiency in the CPU 106 in FIG. 1, the cores 104A, 104B may be configured to move different threads between different cores 104A, 104B to offload workload and optimize performance. Cores may be organized into groups known as "clusters." Each cluster may include one or more cores, and may also include shared cluster resources that can be accessed by any core within the cluster. To move threads between different cores 104A, 104B, there must be interconnection paths between the different cores 104A, 104B to pass information, such as architectural state information (e.g., program counter (PC), architectural registers, and memory state) for the thread. In this regard, it may be desired to physically locate similar processing circuits 108A(1)-108A(N), 108B(1)-108B(N) in the cores 104A, 104B close together in the 2DIC 100 to minimize the communication latency between different processing circuits 108A(1)-108A(N), 108B(1)-108B(N), and thus reducing the latency and energy overhead. However, the 2DIC 100 having one 2D planar die and semiconducting layer has limitations in how close the processing circuits 108A(1)-108A(N), 108B(1)-108B(N) of the cores 104A, 104B can be physically located to each other. It may also be desired to locate processing circuits 108A(1)-108A(N), 108B(1)-108B(N) in the cores 104A, 104B physically close together in the 2DIC 100 if the cores 104A, 104B are configured to be "fused" together for performance efficiencies, wherein one core 104A, 104B is configured to utilize the processing circuits 108B(1)-108B(N), 108(1)-108A(N) of the other core 104B, 104A as part of its instruction pipeline for processing and executing instructions. Again, the 2DIC 100 having one 2D planar die and semiconducting layer has limitations in how close the processing circuits 108A(1)-108A(N), 108B(1)-108B(N) of the cores 104A, 104B can be physically located to each other.

FIG. 2 is an exemplary 3DIC 200 that includes a CPU 202 that can include multiple cores 204 for performing computation functions. In this example, two cores 204A, 204B are provided in the CPU 202 in the 3DIC 200. Providing the CPU 202 in the 3DIC 200 allows processing circuits 206A(1)-206A(N), 206B(1)-206B(N) of the cores 204A, 204B to be coupled together for operations, such as workload sharing and sharing resources for parallel processing, such as used in core fusion for example, with less interconnect distance, thus minimizing communication latency and energy overhead. A 3DIC is a chip in which two or more semiconducting or active layers can be provided in respective IC tiers for forming active electronic components therein. The IC tiers can then be integrated both vertically and horizontally into a single IC to be provided in an integrated 3D semiconducting die. This is shown in the 3DIC 200 in FIG. 2, wherein two IC tiers 208(1), 208(2) are shown. Each IC tier 208(1), 208(2) is a die 210(1), 210(2) that may include a substrate layer, with semiconducting or active layer disposed thereon for forming active devices. The dies 210(1), 210(2) are stacked on top of each other and overlap each other in the vertical direction, which is the Z-axis direction in FIG. 2. In this example, each core 204A, 204B is fully self-contained on a respective IC tier 208(1), 208(2) in the 3DIC 200. Each core 204A, 204B includes respective processing circuits 206A(1)-206A(N), 206B(1)-206B(N), which can be any of the processing circuit examples discussed above and examples of which will be described in more detail below.

To provide electrical interconnections between processing circuits 206A(1)-206A(N), 206B(1)-206B(N) of the cores 204A, 204B disposed in different IC tiers 208(1), 208(2) in the 3DIC 200 to allow such operations such as sharing workload and/or core fusion for improved performance efficiency, inter-tier interconnects 212 in the form of conductive inter-tier vias (ITVs) 214 are fabricated in the 3DIC 210 to electrically couple electrical components between different IC tiers 208(1), 208(2). Via stands for vertical interconnect access. As non-limiting examples, the ITVs 214 could be through-silicon-vias (TSVs), face-to-face interconnect vias, and/or metal pads. The inter-tier interconnects 212 allow the processing circuits 206A(1)-206A(N), 206B(1)-206B(N) to communicate with each other to allow the dies 210(1), 210(2) and 3DIC 200 to act as a single device, which is a CPU 202 in this example. Thus, because the 3DIC 200 in FIG. 2 can overlap the IC tiers 208(1), 208(2) containing the respective cores 204A, 204B, processing circuits 206A(1)-206A(N), 206B(1)-206B(N) that need to communicate with each other according to the CPU 202 design can be located in their respective IC tiers 208(1), 208(2) to overlap or be aligned in a same or substantially same areas 216A(1)-216A(N), 216B(1)-216B(N) in the vertical direction (Z-axis direction) with each other to minimize their interconnection distance and associated resistance-capacitance (RC) delay, thus minimizing communication latency and energy overhead. Even if the processing circuits 206A(1)-206A(N), 206B(1)-206B(N) that need to communicate with each other according to the CPU 202 design do not overlap with each other as disposed in their respective IC tiers 208(1), 208(2), the use of the inter-tier interconnects 212 to couple such processing circuits 206A(1)-206A(N), 206B(1)-206B(N) from their respective IC tiers 208(1), 208(2) may still reduce communication distance, thus improving performance of the CPU 202.

Thus, the 3DIC 200 allows tight integration of the processing circuits 206A(1)-206A(N), 206B(1)-206B(N) of the cores 204A, 204B, as opposed to 2DICs that do not include multiple stacked dies with vertical interconnect routing therebetween. For example, as shown in FIG. 2, processing circuits 206A(1), 206B(1) may be the same type of circuit for their respective cores 204A, 204B, processing circuits 206A(2), 206B(2) may be the same type of circuit for their respective cores 204A, 204B, and processing circuits 206A(N), 206B(N) may be the same type of circuit for their respective cores 204A, 204B. If it is desired to vertically align these same types of processing circuits 206A(1)-206A(N), 206B(1)-206B(N) with each other, the processing circuits 206A(1)-206A(N), 206B(1)-206B(N) can be located in the dies 210(1), 210(2) of the respective IC tiers 208(1), 208(2) so that same types of processing circuits align or overlap with each other in the vertical (Z-axis) direction to minimize the interconnection distances between them. However, the same types of processing circuits 206A(1)-206A(N), 206B(1)-206B(N) do not have to be vertically aligned with each other. For example, as discussed in more detail below, if the cores 204A, 204B are configured to perform fusion with each other for parallel processing, it may be desired to align dissimilar processing circuits 206A(1)-206A(N), 206B(1)-206B(N) with each other in the dies 210(1), 210(2) of the respective IC tiers 208(1), 208(2).

Figure 3:
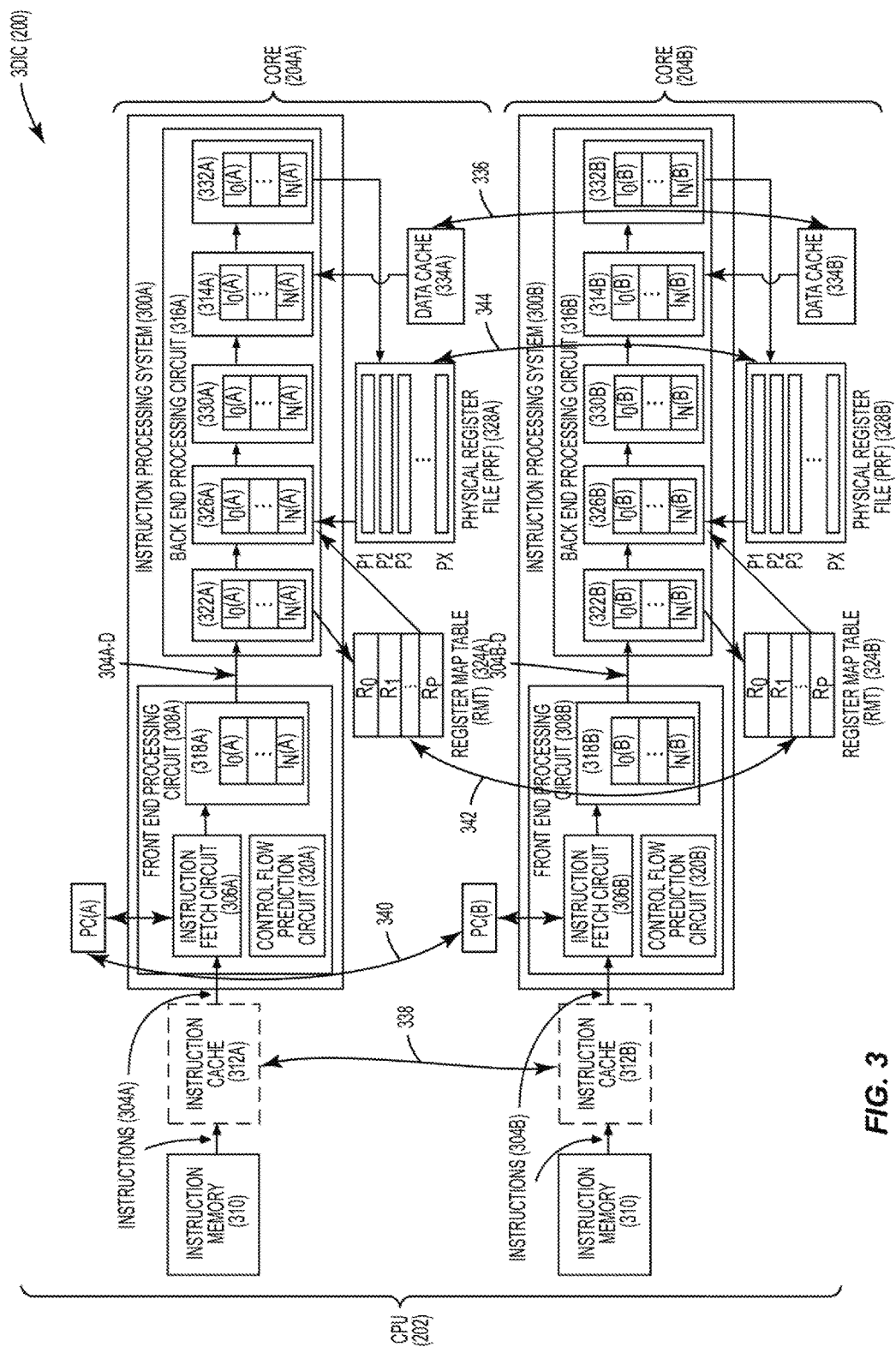
FIG. 3 is a block diagram of exemplary instruction processing systems of the cores in the multi-processor core 3DIC in FIG. 2, and further illustrates the sharing of circuits between the cores through inter-tier communication between the IC tiers in which the cores reside.

To illustrate more non-limiting, exemplary detail of the cores 204A, 204B in the 3DIC 200 in FIG. 2 and their processing circuits 206A(1)-206A(N), 206B(1)-206B(N), FIG. 3 is provided. FIG. 3 is a block diagram of exemplary instruction processing systems 300A, 300B that can be provided in the respective cores 204A, 204B in the CPU 202. Thus, each instruction processing system 300A, 300B is included in its own respective IC tier 208(1), 208(2) of the 3DIC 200 in FIG. 2. The instruction processing systems 300A, 300B include processing circuits that are each configured to process instructions and/or support other processing circuits in the processing of instructions to be executed by a respective core 204A, 204B or other processor or processing unit. In this regard, the instruction processing system 300A for core 204A will be described, but note that the description of the instruction processing system 300A is also applicable to the instruction processing system 300B for core 204B. Further note that the cores 204A, 204B in FIG. 3 may be homogeneous cores, meaning that the cores are designed to be the same, with a same or substantially a same capacities and performance, or heterogeneous cores, meaning that the cores are designed with different capacities and performance. For example, heterogeneous cores are designed to exhibit different power and performance characteristics to mitigate conflicting demands between performance and power efficiency. In this manner, a CPU employing heterogeneous cores may move different threads between different cores to optimize performance. The cores may be organized into groups known as "clusters." Each cluster may include one or more cores, and may also include shared cluster resources that can be accessed by any core within the cluster. Multiple clusters may be further organized into heterogeneous "clustered processor cores." Each clustered processor core may include shared hardware resources that may be utilized by the multiple clusters. The shared hardware resources may include one or more execution units (e.g., floating point units and/or arithmetic logic units) and/or caches (e.g., data caches), as non-limiting examples.

With reference to the instruction processing system 300A in FIG. 3, instructions 304A are fetched by an instruction fetch circuit 306A provided in a front end processing circuit 308A of the instruction processing system 300A from an instruction memory 310. A program counter circuit PC(A) contains a program counter, which is the address of the next instruction 304A to fetch for processing. The instruction memory 310 may be provided in or as part of a system memory in the core 204A as an example. An instruction cache memory 312A may also be provided in the core 204A to cache the instructions 304A from the instruction memory 310 to reduce latency in the instruction fetch circuit 306A fetching the instructions 304A. As will be discussed in more detail below, in this example, the instruction fetch circuit 306A is configured to provide the fetched instructions 304A into one or more instruction pipelines $I_{0(A)}$-$I_{N(A)}$ in the instruction processing system 300A to be pre-processed before the fetched instructions 304A reach an execution circuit 314A in a back end processing circuit 316A in the instruction processing system 300A to be executed. As will next be discussed, the instruction pipelines $I_{0(A)}$-$I_{N(A)}$ are provided across different processing circuits or stages of the instruction processing system 300A to pre-process and process the instructions 304A in a series of steps that perform concurrently to increase throughput prior to execution of the instructions 304A in the execution circuit 314A.

With continuing reference to FIG. 3, the front end processing circuit 308A of the instruction processing system 300A in this example includes an instruction decode circuit 318A. The instruction decode circuit 318A is configured to decode the fetched instructions 304A fetched by instruction fetch circuit 306A to determine the type of instruction and actions required, which in turn is used to determine in which instruction pipeline $I_{0(A)}$-$I_{N(A)}$ the instruction 304A should be placed. A control flow prediction circuit 320A is also provided in the front end processing circuit 308A to speculate or predict a target address for a control flow instruction 304A, such as a conditional branch instruction. The prediction of the target address by the control flow prediction circuit 320A is used by the instruction fetch circuit 306A to determine the next instructions 304A to fetch behind the control flow instruction 304A assuming, the control flow instruction 304A will be resolved to jump to the predicted target address.

With continuing reference to FIG. 3, in this example, the fetched instructions 304A are then placed in one or more of the instruction pipelines $I_{0(A)}$-$I_{N(A)}$ and are next provided to a rename circuit 322A in the back end processing circuit 316A of the instruction processing system 300A. The rename circuit 322A is configured to determine if any register names in the decoded instructions 304A need to be renamed to break any register dependencies that would prevent parallel or out-of-order processing (OoP) of the instructions 304A. The instruction processing system 300A in FIG. 3 is capable of processing instructions out-of-order, if possible, to achieve greater throughput performance and parallelism. However, the number of architectural registers provided in the core 204A may be limited. In this regard, the rename circuit 322A provided in the back end processing circuit 316A of the instruction processing system 300A is configured to call upon a register map table (RMT) circuit 324A to rename the logical source and destination register names to available physical register names in a physical register file (PRF) circuit 328A that typically provides more registers than architectural registers available. An allocate circuit 326A in a next step of the back end processing circuit 316A reads the physical registers containing source operands from the physical register file circuit 328A to determine if the producing instruction 304A responsible for producing the value has been executed. If the producing instruction 304A has not yet been executed, the value will be received by the producing instruction 304A via a live forwarding path. An issue circuit 330A (also known as a "dispatch circuit") can dispatch instructions 304A out-of-order to execution units in the execution circuit 314A after identifying and arbitrating among instructions 304A that have all their source operations ready. The execution circuit 314A has access to a data cache memory 334A for storing a result of execution of an instruction 304A to memory. A commit circuit 332A is also provided in the back end processing circuit 316A as a final stage configured to update the architectural and memory state of the core 204A for executed instructions 304A and to process exceptions caused by the executed instructions 304A.

The cores 204A, 204B can be configured to share certain resources, such as processing circuits in each of their respective instruction processing systems 300A, 300B. For example, it may be desired for the cores 204A, 204B to share the data cache memories 334A, 334B so that execution circuits 314A, 314B in the back end processing circuits 316A, 316B can store results into either data cache memory 334A, 334B. This can be provided in the 3DIC 200 in FIG. 2 by providing at least one inter-tier interconnect 336 between the data cache memories 334A, 334B, as logically shown in FIG. 3. The at least one inter-tier interconnect 336 can communicatively couple the first instruction processing system 300A in core 204A in the first IC tier 208(1), with the data cache memory 334B in the core 204B in the second IC tier 208(2). Likewise, the at least one inter-tier interconnect 336 can couple the second instruction processing system 300B in core 204B in the second IC tier 208(2), with the data cache memory 334A in the core 204A in the first IC tier 208(1). This allows the core 204A to access the data cache memory 334B in core 204A, and the core 204B to access the data cache memory 334A in core 204B. For example, the at least one inter-tier interconnect 336 can allow the data cache memories 334A, 334B to effectively form a shared data cache memory in the 3DIC 200 in FIG. 2, even though the data cache memories 334A, 334B are located in different IC tiers 208(1), 208(2), with minimized communication latency because of their close proximity accessible through the at least one inter-tier interconnect 336.

As another example, it may be desired for the cores 204A, 204B to share the instruction cache memories 312A, 312B so that instructions 304A, 304B can be fetched from the cores 204A, 204B from either instruction cache memory 312A, 312B. This can be provided in the 3DIC 200 in FIG. 2 by providing at least one inter-tier interconnect 338 between the instruction cache memories 312A, 312B, as logically shown in FIG. 3. The at least one inter-tier interconnect 338 can communicatively couple the first instruction processing system 300A in core 204A in the first IC tier 208(1), with the instruction cache memory 312B in the core 204B in the second IC tier 208(2). Likewise, the at least one inter-tier interconnect 338 can couple the second instruction processing system 300B in core 204B in the second IC tier 208(2), with the first instruction cache memory 312A in the core 204A in the first IC tier 208(1). This allows the core 204A to access the instruction cache memory 312B in core 204B, and the core 204B to access the first instruction cache memory 312A in core 204A. For example, the at least one inter-tier interconnect 338 can allow the instruction cache memories 312A, 312B to effectively form a shared instruction cache memory in the 3DIC 200 in FIG. 2, even though the instruction cache memories 312A, 312B are located in different IC tiers 208(1), 208(2), with minimized communication latency because of their close proximity accessible through the at least one inter-tier interconnect 338.

Figure 4:
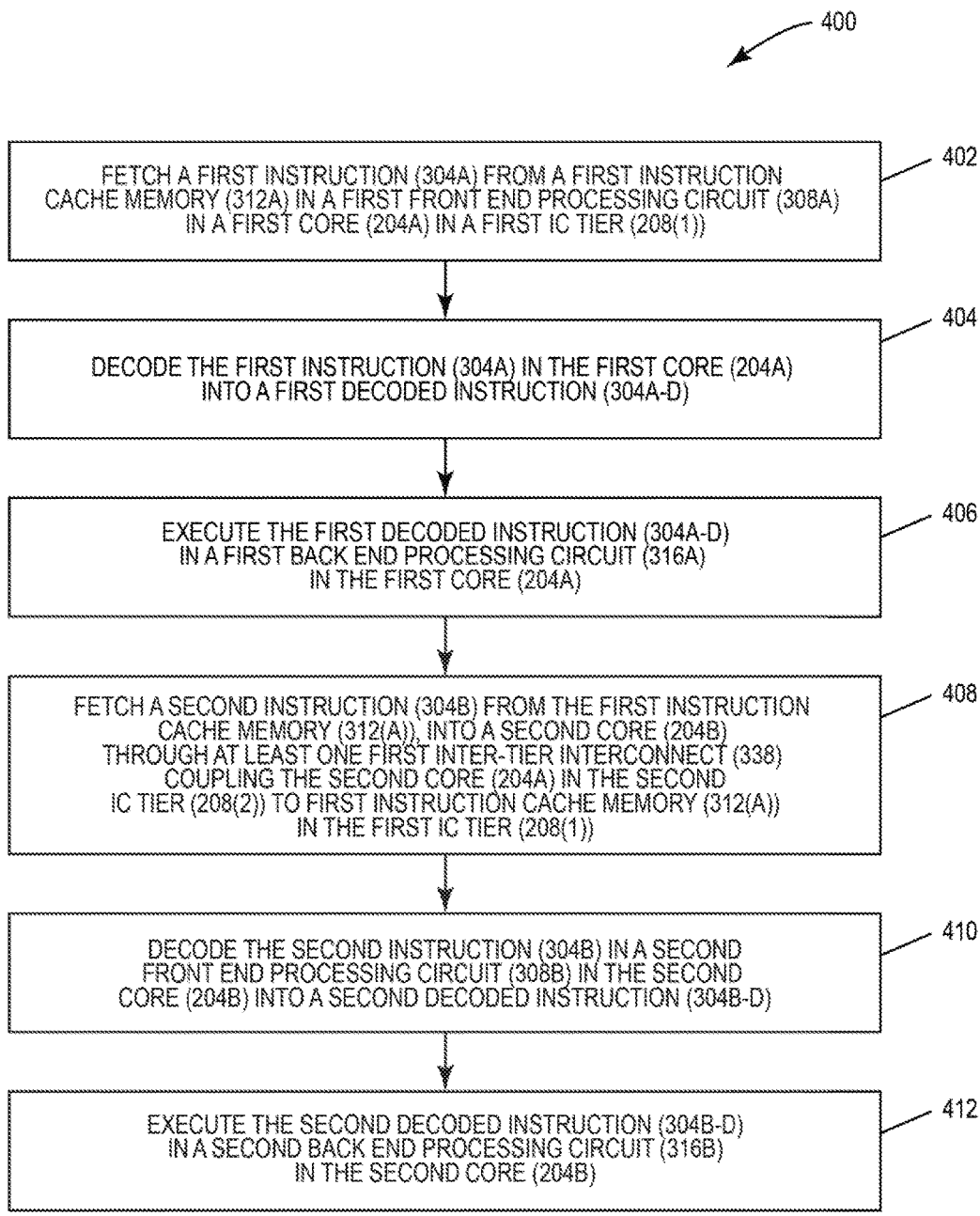
FIG. 4 is a flowchart illustrating an exemplary process of the instruction processing systems of the cores in the multi-processor core 3DIC shown in FIG. 3 communicating with each other to share circuit resources between different cores to optimize performance.

FIG. 4 is a flowchart illustrating an exemplary process 400 of the instruction processing systems 300A, 300B of the cores 204A, 204B in the 3DIC 200 in FIG. 3 communicating with each other to access each other's instruction cache memories 312A, 312B. In this regard, as shown in FIG. 4, the instruction fetch circuit 306A in the front end processing circuit 308A of the core 204A in the first tier 208(1) fetches a first instruction 304A from a first instruction cache memory 312A (block 402). The instruction decode circuit 318A decodes the first instruction 304A in the first core 204A into a decoded instruction 304A-D (block 404). The execution circuit 314A in the back end processing circuit 316A in the core 204A will eventually receive and execute the decoded instruction 304A-D (block 406). The instruction fetch circuit 306B in the front end processing circuit 308B of the core 204B in the second IC tier 208(2) may fetch an instruction 304B from the instruction cache memory 312B through the at least one inter-tier interconnect 338 coupling the core 204B in the second IC tier 208(2) to the instruction cache memory 312A in the first IC tier 208(1) (block 408). The instruction decode circuit 318B in the core 204B decodes the instruction 304B into a decoded instruction 304B-D (block 410). The execution circuit 314B in the second back end processing circuit 316B in the core 204B will eventually receive and execute the decoded instruction 304B-D (block 412). The opposite of the process 400 in FIG. 4 is also possible wherein the operations discussed therein with regard to core 204A, 204B and their accessed resources are reversed.

With reference back to FIG. 3, another example that may provide the need or desire to provide inter-tier interconnections between the cores 204A, 204B is if the cores 204A, 204B are configured to migrate process threads from one core 204A to another core 204B, or vice versa. In this instance, it may be desired or necessary to exchange information regarding the architectural state in the core 204A, 204B that was executing the thread before it was transferred to the other core 204A, 204B for processing. In this regard, one core 204A, 204B may be configured to transfer a process thread from one instruction processing system 300A to the other instruction processing system 300B, or vice versa. However, the core 204A, 204B that receives the process thread to continue executing needs to be aware of the architectural state that existed for the process thread before the process thread was transferred. The architectural state of a core 204A, 204B is the part of a core 204A, 204B which stores information regarding the state of a process, which can include a program counter (PC), control registers, general purpose registers, and memory states, for example. The architectural state of a core 204A, 204B is stored in architectural state circuits, which in the example in FIG. 3 can include the respective program counters PC(A), PC(B), the register map table circuits 324A, 324B, and the physical register file circuits 328A, 328B. In this regard, as shown in FIG. 3, one or more inter-tier interconnects 340, 342, 344 can be provided in the 3DIC 200 to couple these circuits between the two cores 204A, 204B in the IC tiers 208(1), 208(2) therein. The inter-tier interconnects 340, 342, 344 allow a processing circuit in the instruction processing system 300A in core 204A to access the architectural state circuits in the core 204B, and vice versa.

Figure 5:
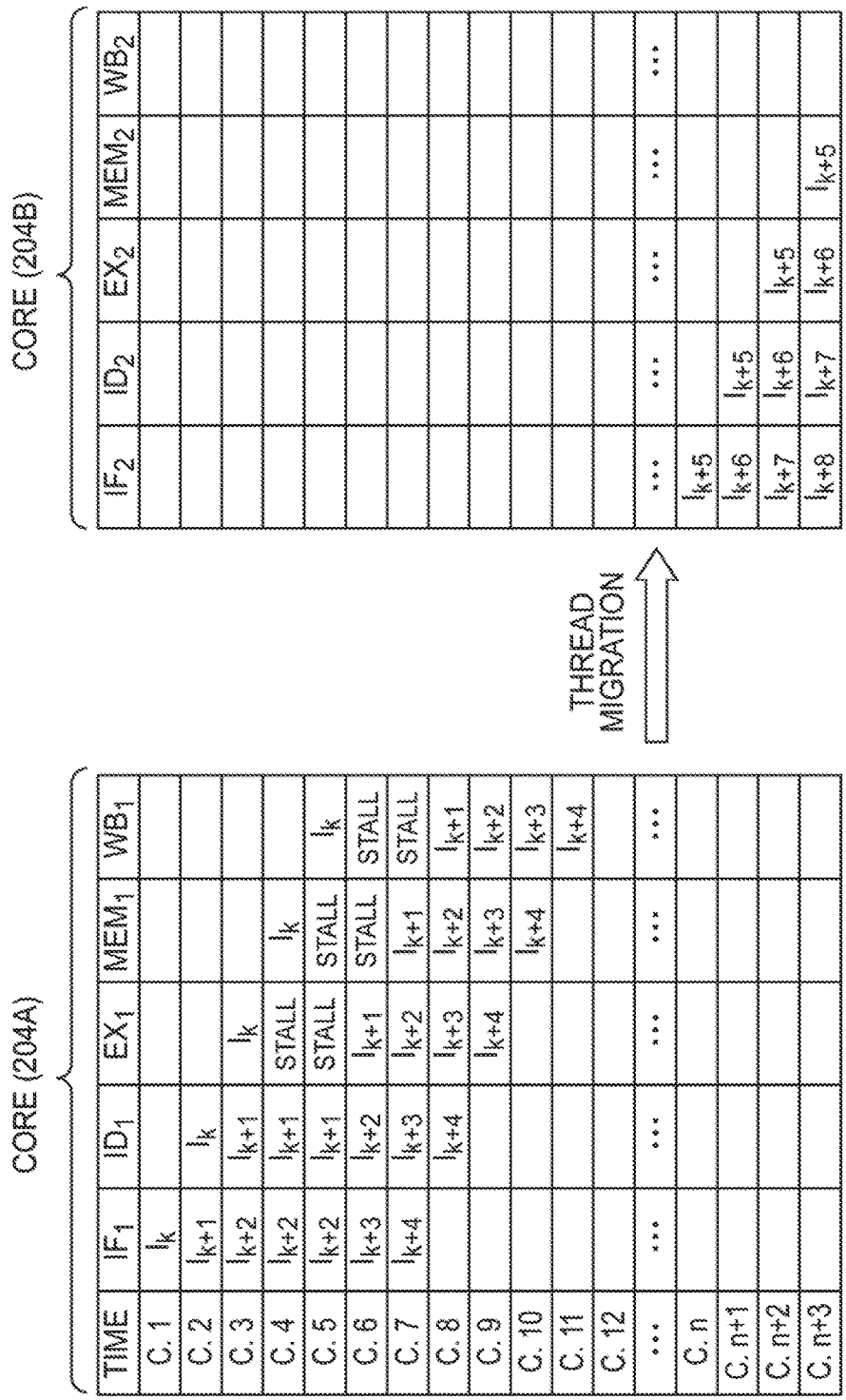
FIG. 5 is a diagram illustrating an exemplary process migration between the instruction processing systems of the cores in the multi-processor core 3DIC shown in FIG. 3.

FIG. 5 is a diagram illustrating an exemplary process thread migration from one instruction processing system 300A, 300B of the cores 204A, 204B in the 3DIC 200 in FIG. 3 to the other core 204A, 204B to further illustrate an example. In this regard, as shown in FIG. 5, a process thread that includes instructions $I_k$-$I_{k+8}$ is shown being pipeline processed in the various pipeline states of the instruction pipelines $I_{0(A)}$-$I_{N(A)}$, $I_{0(B)}$-$I_{N(B)}$ in the respective instruction processing system 300A, 300B in the cores 204A, 204B in the 3DIC 200. Instructions $I_k$-$I_{k+8}$ are instructions 304A, 304B in FIG. 3. For example, as shown in FIG. 5, at time C.1, instruction $I_k$ is fetched by the instruction fetch circuit 306A in phase $IF_1$ in the front end processing circuit 308A in the core 204A, decoded by the instruction decode circuit 318A in phase $ID_1$ as instruction $I_{k+1}$ at time C.2, executed in execution circuit 314A in phase $EX_1$ at time C.3, the result of such execution written back to the data cache memory 334A by the execution circuit 314A in phase $MEM_1$ at time C.4, and written back by the commit circuit 332A in phase $WB_1$ at time C.5. Other instructions $I_{k+1}$-$I_{k+4}$ are fetched at subsequent times C.2-C.7 as shown and processed. As shown in FIG. 3, the process thread is migrated from processing in core 204A to core 204B before instruction $I_{k+5}$ is fetched. This may have resulted from core 204A not being able to efficiently continue with processing the process thread due to other higher priority process threads needing to be executed and/or the core 204B having more capacity to process instructions, as examples. In this regard, the contents of the program counter PC(A), the register map table circuit 324A and the physical register file circuit 328A, can be transferred over the inter-tier interconnects 340, 342, 344 from core 204A to core 204B. Core 204B can then continue with the processing of instructions $I_{k+5}$-$I_{k+8}$ as shown.

Figure 6A:
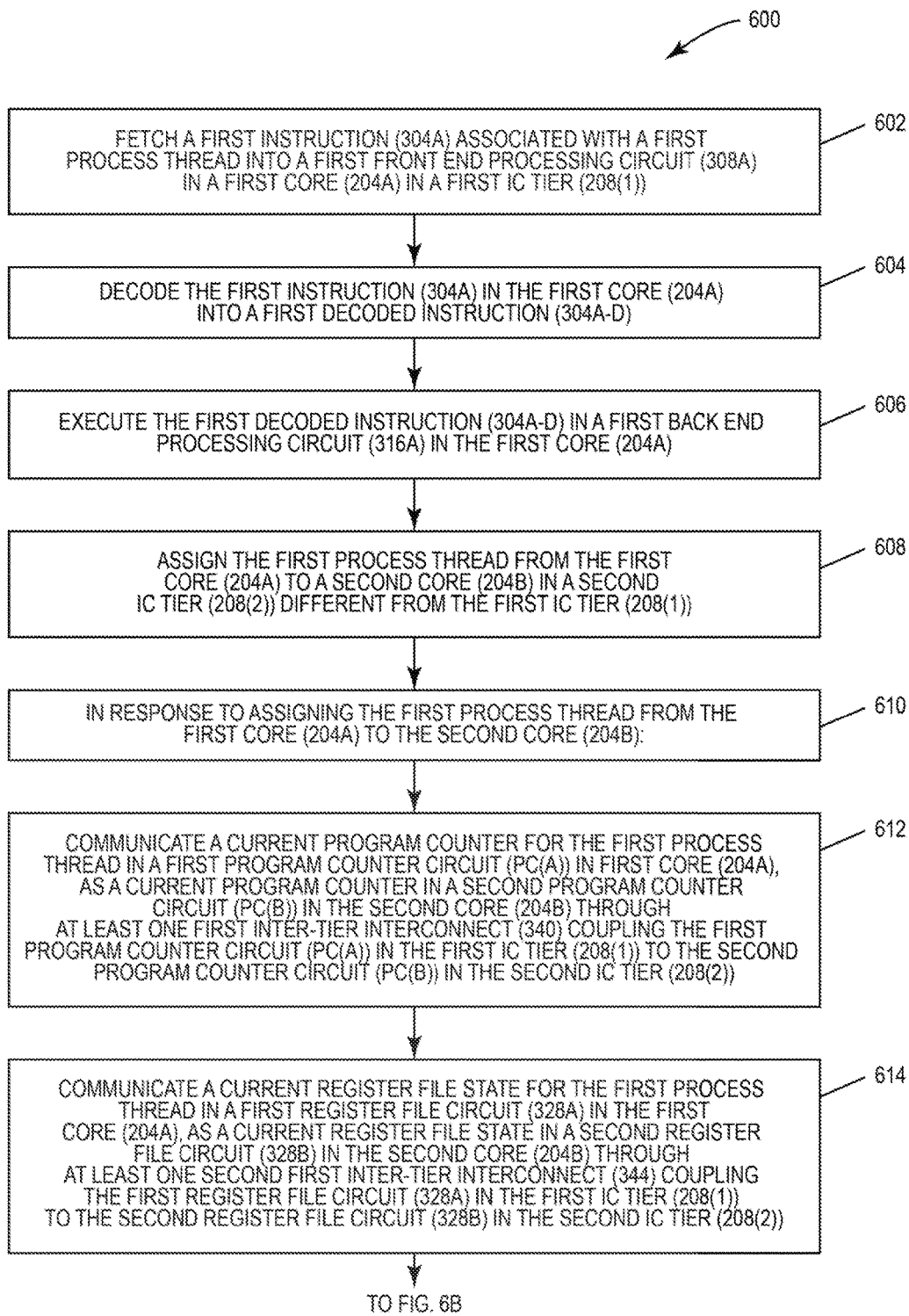
FIGS. 6A and 6B are flowcharts illustrating an exemplary process of process migration between the instruction processing systems of the cores in the multi-processor core 3DIC shown in FIG. 3 to optimize performance.
Figure 6B:
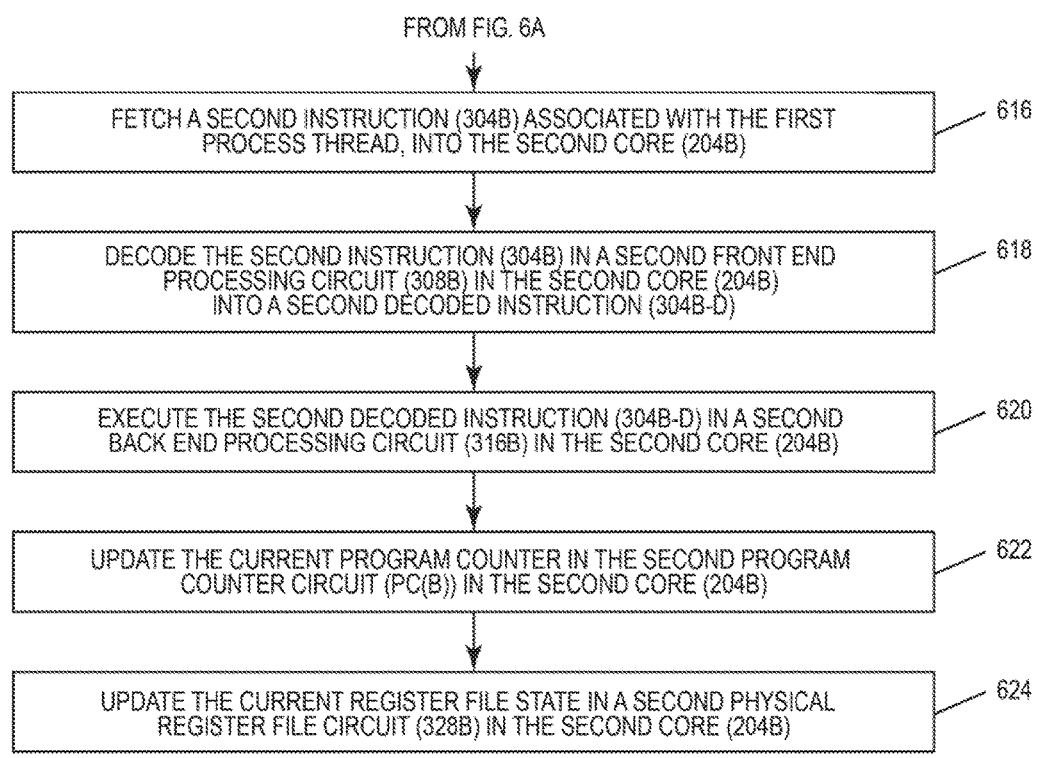

FIGS. 6A and 6B are flowcharts illustrating an exemplary process 600 of the process migration between the instruction processing systems 300A, 300B of the cores 204A, 204B in the 3DIC 200 shown in FIG. 3 to optimize performance. In this regard, the instruction fetch circuit 306A fetches an instruction 304A associated with a first process thread into the front end processing circuit 308A in a core 204A in a first IC tier 208(1) (block 602). The instruction decode circuit 318A decodes the instruction 304A in the core 204A into a first decoded instruction 304A-D (block 604). The execution circuit 314A in the back end processing circuit 316A of the core 204A executes the decoded instruction 304A-D (block 606). The first process thread is then assigned from the core 204A to the core 204B in a second IC tier 208(2) different from the first tier 208(1) (block 608). In response to assigning the first process thread from the core 204A to the core 204B, the instruction processing system 300A communicates a current program counter for the first process thread in the program counter circuit PC(A) in the core 204A, as a current program counter in the program counter circuit PC(B) in the core 204B through the at least one first inter-tier interconnect 340 coupling the first program counter circuit PC(A) in the first IC tier 208(1) to the second program counter circuit PC(B) in the second IC tier 208(2) (block 612). Also in response to assigning the first process thread from the core 204A to the core 204B, the instruction processing system 300A communicates a current register file state for the first process thread in the physical register file circuit 328A in the core 204A, as a current register file state in a physical register file circuit 328B in the core 204B through at least one second first inter-tier interconnect 344 coupling the physical register file circuit 328A in the first IC tier 208(1) to the physical register file circuit 328B in the second IC tier 208(2) (block 614).

With continuing reference to FIGS. 6A and 6B, with the migration of the first process thread from the core 204A to the core 204B, the instruction fetch circuit 306B in the front end processing circuit 308B of the instruction processing system 300B fetches an instruction 304B associated with a first process thread into the front end processing circuit 308B in the core 204B in the first IC tier 208(1) (block 616). The instruction decode circuit 318B decodes the instruction 304B in the core 204B into a first decoded instruction 304B-D (block 618). The execution circuit 314B in the back end processing circuit 316B of the core 204B executes the decoded instruction 304B-D (block 620). The front end processing 308B updates the current program counter in the program counter circuit PC(B) in the core 204B (block 622), and updates the current register file state in a physical register file circuit 328B also in the core 204B (block 624).

Figure 7:
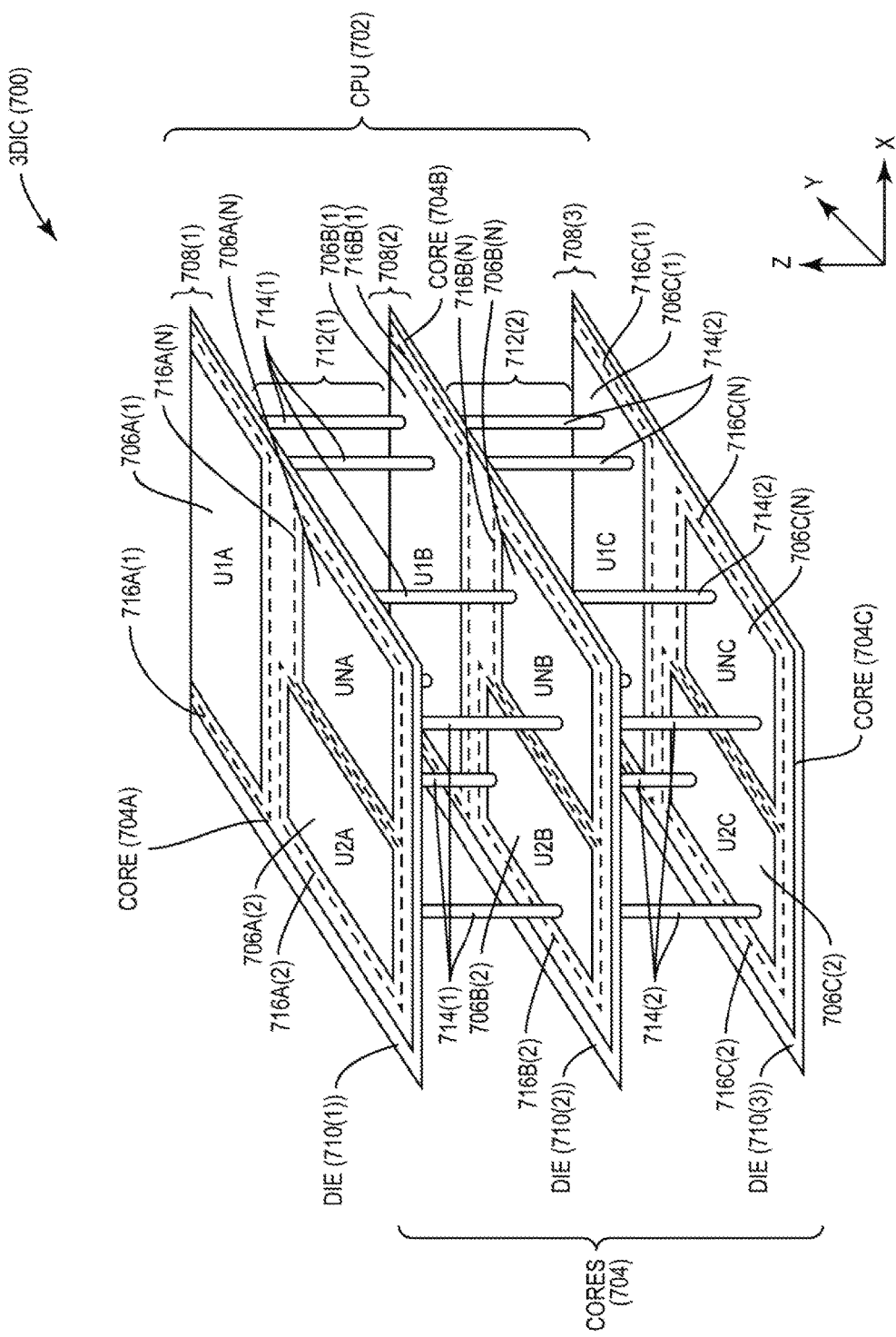
FIG. 7 is another exemplary multi-processor core 3DIC that includes three (3) cores self-contained on a single IC tier in the 3DIC with common types of circuits aligned with each other between different IC tiers, wherein the cores are configured to communicate with another core in a different IC tier to offload workload and/or share resources for improved CPU performance.

More than two cores can be provided in a 3DIC that has more than two IC tier. For example, FIG. 7 is an exemplary 3DIC 700 that includes a CPU 702 that includes three (3) cores 704A, 704B, 704C for performing computation functions. Providing the CPU 702 in the 3DIC 700 allows processing circuits 706A(1)-706A(N), 706B(1)-706B(N), 706C(1)-706C(N) of the cores 704A, 704B, 704C to be coupled together for operations, such as workload sharing and sharing resources for parallel processing, such as used in core fusion for example, with less interconnect distance, thus minimizing communication latency and energy overhead. In this example, each core 704A, 704B, 704C is provided in a separate IC tier 708(1)-708(3). Each IC tier 708(1)-708(3) is a die 710(1)-710(3) that may include a substrate layer, with a semiconducting or active layer disposed thereon for forming active devices. The dies 710(1)-710(3) are stacked on top of each other and overlap each other in the vertical direction, which is the Z-axis direction in FIG. 7. In this example, each core 704A, 704B, 704C is fully self-contained on a respective IC tier 708(1), 708(2), 708(3) in the 3DIC 700. Each core 704A, 704B, 704C includes respective processing circuits 706A(1)-706A(N), 706B(1)-706B(N), 706C(1)-706C(N) which can be any of the processing circuit examples discussed above and examples of which will be described in more detail below.

To provide electrical interconnections between processing circuits 706A(1)-706A(N), 706B(1)-706B(N), 706C(1)-706C(N) of the cores 704A, 704B, 704C disposed in different IC tiers 708(1)-708(3) in the 3DIC 700 to allow such operations such as sharing workload and/or core fusion for improved performance efficiency, inter-tier interconnects 712(1), 712(2) in the form of conductive ITVs 714(1), 714(2) (e.g., TSVs, face-to-face interconnect vias, metal pads) are fabricated in the 3DIC 700 to electrically couple electrical components between different IC tiers. The inter-tier interconnects 712(1), 712(2) allow the processing circuits 706A(1)-706A(N), 706B(1)-706B(N), 706C(1)-706C(N), to communicate with each other to allow the dies 710(1)-710(3) and 3DIC 700 to act as a single device, which is a CPU 702 in this example. In this example, the inter-tier interconnects 712(1) can couple the processing circuits 706A(1)-706A(N) and 706B(1)-706B(N) between the cores 704A, 704B. The inter-tier interconnects 712(2) can couple the processing circuits 706B(1)-706B(N) and 706C(1)-706C(N) between the cores 704B, 704C. Thus, because the 3DIC 700 in FIG. 7 can overlap the IC tiers 708(1)-708(3) containing the respective cores 704A, 704B, 704C, the processing circuits 706A(1)-706A(N), 706B(1)-706B(N), 706C(1)-70C(N), that need to communicate with each other according to the CPU 702 design can be located in their respective IC tiers 708(1)-708(3) to overlap or be aligned in a same or substantially a same area 716A(1)-716A(N), 716B(1)-716B(N), 716C(1)-716C(N) in the vertical direction (Z-axis direction) with each other to minimize their interconnection distance and associated resistance-capacitance (RC) delay, thus minimizing communication latency and energy overhead. Even if the processing circuits 706A(1)-706A(N), 706B(1)-706B(N), 706C(1)-706C(N) that need to communicate with each other according to the CPU 702 design do not overlap with each other as disposed in their respective IC tiers 708(1)-708(3), the use of the inter-tier interconnects 712(1), 712(2) to couple such processing circuits 706A(1)-706A(N), 706B(1)-706B(N), 706C(1)-706C(N) from their respective IC tiers 708(1), 708(2), 708(3) may still reduce communication distance, thus improving performance of the CPU 202.

Thus, the 3DIC 700 allows tight integration of the processing circuits 706A(1)-706A(N), 706B(1)-706B(N), 706C(1)-706C(N) of the cores 704A, 704B, 704C as opposed to 2DICs that do not include multiple stacked dies with vertical interconnect routing therebetween. For example, as shown in FIG. 7, processing circuits 706A(1), 706B(1), 706C(1) may be the same type of circuit for their respective cores 704A, 704B, 704C processing circuits 706A(2), 706B(2), 706C(2) may be the same type of circuit for their respective cores 704A, 704B, 704C and processing circuits 706A(N), 706B(N), 706C(N) may be the same type of circuit for their respective cores 704A, 704B, 704C. If it is desired to vertically align these same types of processing circuits 706A(1)-706A(N), 706B(1)-706B(N), 706C(1)-706C(N) with each other, the processing circuits 706A(1)-706A(N), 706B(1)-706B(N), 706C(1)-706C(N) can be located in the dies 710(1), 710(2), 710(3) of the respective IC tiers 708(1), 708(2), 708(3) so that same types of processing circuits align or overlap with each other in the vertical (Z-axis) direction to minimize the interconnection distances between them. However, the same types of processing circuits 706A(1)-706A(N), 706B(1)-706B(N), 706C(1)-706C(N) do not have to be vertically aligned with each other. For example, as discussed in more detail below, if the cores 704A, 704B, 704C are configured to perform fusion with each other for parallel processing, it may be desired to align dissimilar processing circuits 706A(1)-706A(N), 706B(1)-706B(N), 706C(1)-706C(N), with each other in the dies 710(1)-710(3) of the respective IC tiers 708(1)-708(3).

Figure 8:
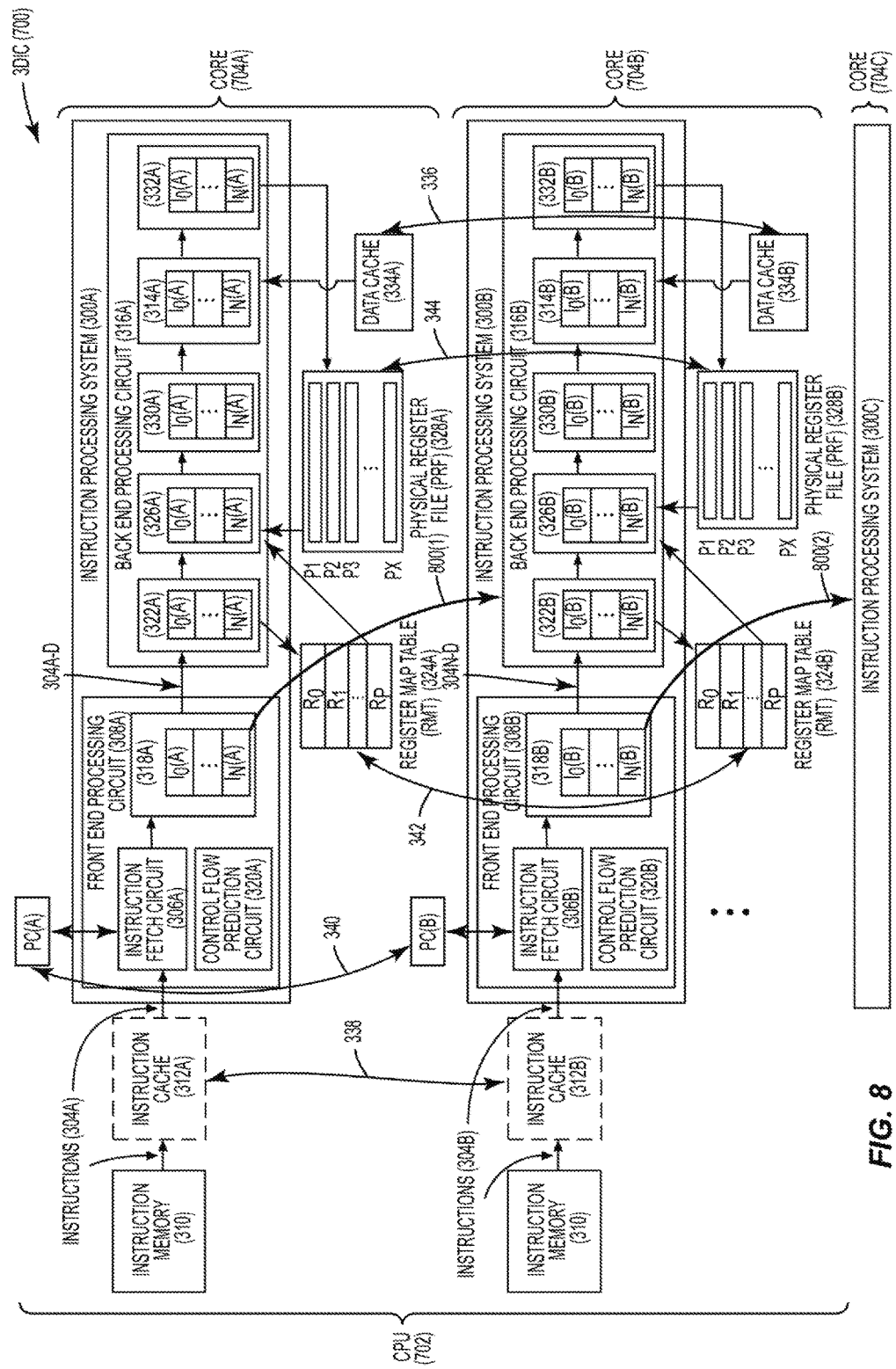
FIG. 8 is a block diagram of the exemplary instruction processing systems of the cores in the multi-processor core 3DIC in FIG. 7, and further illustrates the "fusing" of a front-end processing stage of the instruction processing systems of one core, to a back-end processing circuit of the instruction processing systems of three (3) cores through intra-tier and inter-tier communication.

FIG. 8 is block diagram of exemplary instruction processing systems that can be provided in the cores 704A, 704B, 704C in the 3DIC 700 in FIG. 7, and further illustrates the "fusing" of a front-end processing stage of the instruction processing systems of one core 704A, 704B, 704C, to the back-end processing circuit of the instruction processing systems of cores 704A, 704B, 704C. FIG. 8 illustrates the instruction processing system 300A in FIG. 3 for core 204A as being the instruction processing system of core 704A. FIG. 8 also illustrates the instruction processing system 300B in FIG. 3 for core 204B as the instruction processing system of core 704B. Core 704C can also include an instruction processing system 300C that is the instruction processing systems 300A, 300B provided in cores 704A, 704B. The instruction processing systems 300A, 300B, 300C are as described in FIG. 3 and thus will not be re-described here. As shown in FIG. 8, the 3DIC 700 includes at least one inter-tier interconnect 800(1) coupling the front end processing circuit 308A to the back end processing circuit 316B. Thus for example, if it is determined that the front end processing circuit 308A of core 704A should fuse with the back end processing circuit 318B of core 704B, the core 704A can pass the decoded instruction 304A-D from the instruction fetch circuit 306A to the rename circuit 322B in the back end processing circuit 316B of core 704B to be processed and executed as an example. For example, the back end processing circuit 316B of core 704B may have greater processing capabilities and throughput than core 704A. Also, fusion between the cores 704A, 704B may be useful to avoid stalls in the front end processing circuit 308A in core 704A for example, where decoded instructions 304A-D can be provided to the back end processing circuit 316B in core 704B for processing. Further, the front end processing circuit 308A in core 704A could also fuse through at least one inter-tier interconnect 800(2) with the back end processing circuit 316C in core 704C.

Any core 704A, 704B, 704C and its processing circuits can fuse with any other processing circuits in the other cores 704A, 704B, 704C as needed or desired. For example, cores 704A, 704B could be fused, while core 704C is not fused with either core 704A, 704B. As another example, cores 704B, 704C could be fused, while core 704A is not fused with either core 704B, 704C. As another example, cores 704A, 704C could be fused, while core 704B is not fused with either core 704A, 704C. As another example, all three cores 704A, 704B, 704C could be fused. For example, as discussed above, the front end processing circuit 308A of core 704A could be fused with both the back end processing circuits 316B, 316C of cores 704B, 704C. Further, any of the process thread migration examples discussed above with regard to cores 204A, 204B in FIG. 3 can also be provided as described in FIG. 3 between any combination of the cores 704A, 704B, 704C. Because in this example, the instruction processing systems 300A, 300B in the cores 204A, 204B in FIG. 3 are like the instruction processing systems 300A, 300B, 300C in the cores 704A, 704B, 704C in FIG. 7, such examples will not be re-described and will be well understood to one of ordinary skill.

Figure 9:
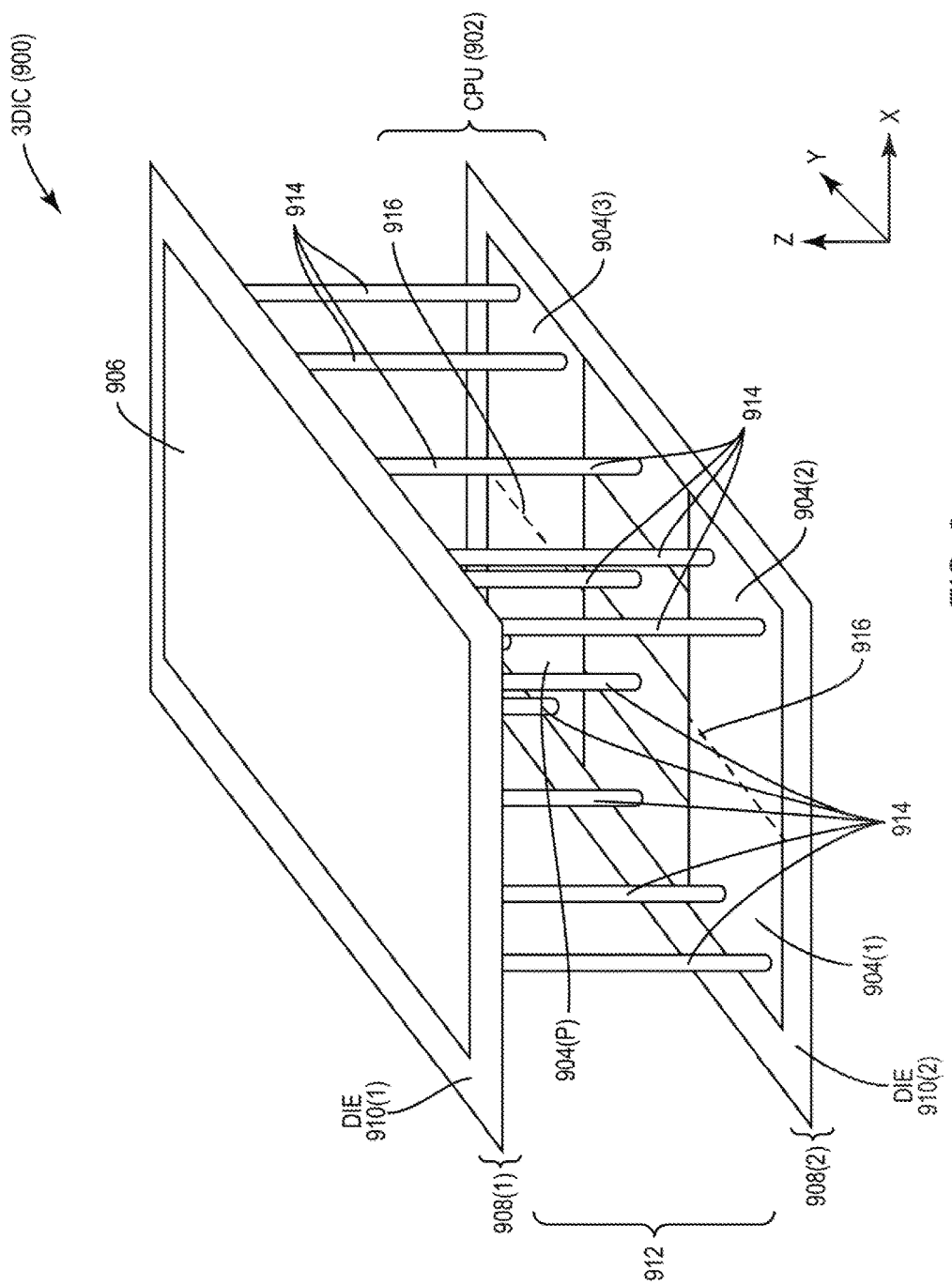
FIG. 9 is another exemplary multi-processor core 3DIC that includes multiple cores self-contained on the same IC tier in the 3DIC, and each core is configured to access a shared cache memory in an adjacent IC tier.

A 3DIC can also facilitate providing IC tiers for other shared resources other than core processing circuits. In this regard, FIG. 9 is an example of a 3DIC 900 that includes a CPU 902 that includes multiple cores 904(1)-904(P) self-contained on a same IC tier 908(1) and a shared cache memory 906 on a separate IC tier 908(1) disposed adjacent and above in the vertical direction (Z-axis direction). In this example, each core 904(1)-904(P) is fully self-contained on the IC tier 908(1) in the 3DIC 900. Each IC tier 908(1), 908(2) is a die 910(1), 910(2) that may include a substrate layer, with a semiconducting or active layer disposed thereon for forming active devices. Inter-tier interconnects 912 in the form of conductive ITVs 914 (e.g., TSVs, face-to-face interconnect vias, metal pads) are fabricated in the 3DIC 900 to electrically couple the cores 904(1)-904(P) to the shared cache memory 906 in the IC tier 908(2) that overlaps the IC tier 908(1). Thus, the cores 904(1)-904(P) can access the shared cache memory 906 through the inter-tier interconnects 912 to minimize access latency and energy overhead. The cores 904(1)-904(P) being on the same IC tier 908(1) can communicate with each other, such as for resource sharing for work offloading, process migration, and/or core fusion through intra-tier interconnects 916, which may be metal lines in metal layers disposed above an active semiconducting layer in the IC tier 908(1). All of the previous examples of resource sharing for work offloading, process migration, and/or core fusion discussed above are equally applicable between the cores 904(1)-904(P) self-contained on the same IC tier 908(1) in the 3DIC 900 in FIG. 9. Further note that the cores 904(1)-904(P) may be homogeneous cores, meaning that the cores are designed the same, with a same or substantially a same capacities and performance, or heterogeneous cores, meaning that the cores are designed with different capacities and performance. For example, heterogeneous cores are designed to exhibit different power and performance characteristics to mitigate conflicting demands between performance and power efficiency.

Figure 10:
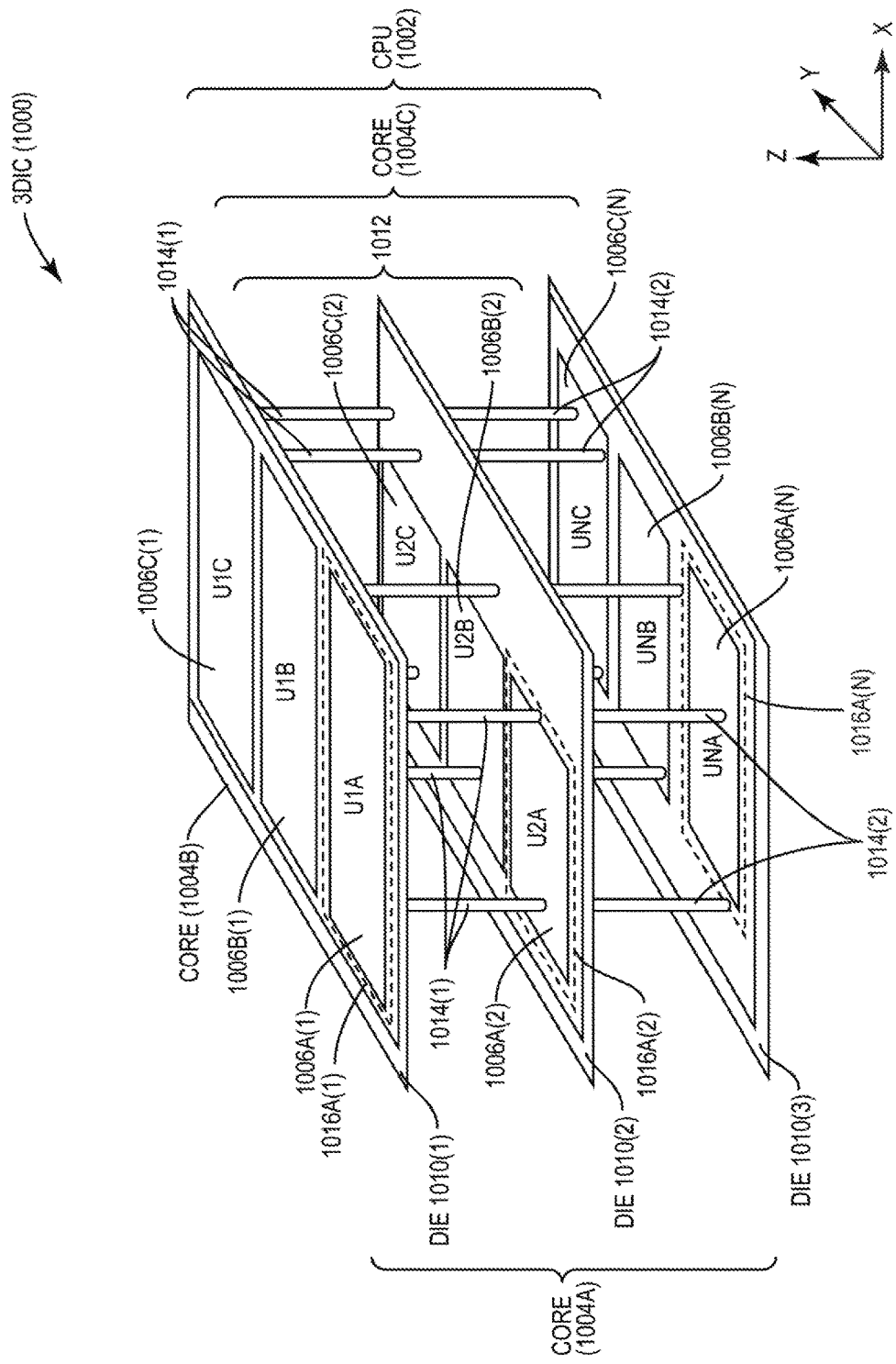
FIG. 10 is an exemplary multi-processor core 3DIC, wherein circuits of each core are split among different IC tiers in the 3DIC, and wherein each core is configured to communicate with a circuit of another core in the same IC tier through intra-tier communication and communicate with a circuit of another core in a different IC tier through inter-tier communication, to offload workload and/or share resources for improved CPU performance.

Cores can also be split among different IC tiers in a 3DIC to provide a CPU wherein inter-tier interconnects can couple different processing circuits separated on different IC tiers for each core, and intra-tier interconnects can couple processing circuits between different cores on the same IC tier. In this regard, FIG. 10 is an exemplary 3DIC 1000 that includes a CPU 1002 that includes three (3) cores 1004A, 1004B, 1004C for performing computation functions. Providing the CPU 1002 in the 3DIC 1000 allows processing circuits 1006A(1)-1006A(N), 1006B(1)-1006B(N), 1006C(1)-1006C(N) of the cores 1004A, 1004B, 1004C to be coupled together for operations, such as workload sharing and sharing resources for parallel processing, such as used in core fusion for example, with less interconnect distance, thus minimizing communication latency and energy overhead. The processing circuits 1006A(1)-1006A(N), 1006B(1)-1006B(N), 1006C(1)-1006C(N) can include any of the processing circuits described above in FIG. 3 for example. In this example, each core 1004A, 1004B, 1004C is spread over different IC tiers 1008(1)-1008(3). For example, processing circuits 1006A(1)-1006A(N) for core 1004A are provided over the three (3) IC tiers 1008(1)-1008(3), processing circuits 1006B(1)-1006B(N) for core 1004B are provided over the same three (3) IC tiers 1008(1)-1008(3), and processing circuits 1006C(1)-1006C(N) for core 1004C are provided over the three (3) IC tiers 1008(1)-1008(3). Each IC tier 1008(1)-1008(3) is a die 1010(1)-1010(3) that may include a substrate layer, with a semiconducting or active layer disposed thereon for forming active devices. The dies 1010(1)-1010(3) are stacked on top of each other and overlap each other in the vertical direction, which is the Z-axis direction in FIG. 10.

To provide electrical interconnections between processing circuits 1006A(1)-1006A(N), 1006B(1)-1006B(N), 1006C(1)-1006C(N) of the cores 1004A, 1004B, 1004C disposed over the different IC tiers 1008(1)-1008(3) in the 3DIC 1000 to allow such operations such as sharing workload and/or core fusion for improved performance efficiency, inter-tier interconnects 1012 in the form of conductive ITVs 1014(1), 1014(2) (e.g., TSVs, face-to-face interconnect vias, metal pads) are fabricated in the 3DIC 1000 to electrically couple electrical components between different IC tiers 1008(1)-1008(3). The inter-tier interconnects 1012 allow the respective processing circuits 1006A(1)-1006A(N), 1006B(1)-1006B(N), 1006C(1)-1006C(N) for the cores 1004A, 1004B, 1004C to communicate across the IC tiers 1008(1)-1008(3) with each other to allow the dies 1010(1)-1010(3) and 3DIC 1000 to act as a single device, which is a CPU 1002 in this example. While spreading the processing circuits 1006A(1)-1006A(N), 1006B(1)-1006B(N), 1006C(1)-1006C(N) for each of the respective cores 1004A, 1004B, 1004C across the IC tiers 1008(1)-1008(3) may incur additional communication latency than if all the processing circuits 1006A(1)-1006A(N), 1006B(1)-1006B(N), 1006C(1)-1006C(N) for a given core 1004A, 1004B, 1004C were self-contained on a single IC tier 1008(1)-1008(3) like shown in FIG. 7 for example, spreading the processing circuits 706A(1)-706A(N), 706B(1)-706B(N), 706C(1)-706C(N) for each of the respective cores 1004A, 1004B, 1004C across the IC tiers 1008(1)-1008(3) may reduce communication latency between processing circuits 1006A(1)-1006A(N), 1006B(1)-1006B(N), 1006C(1)-1006C(N) between different cores 1004A, 1004B, 1004C. This may be advantageous particularly if the design of the CPU 1002 is such that sharing of core resources for work offloading, process migration, and/or core fusion is an often performed task.

Also, because the 3DIC 1000 in FIG. 10 can overlap the IC tiers 1008(1)-1008(3) containing the respective cores 1004A, 1004B, 1004C, processing circuits 1006A(1)-1006A(N), 1006B(1)-1006B(N), 1006C(1)-1000C(N) for a given core 1004A, 1004B, 1004C that need to communicate with each other according to the CPU 1002 design can be located in their respective IC tiers 1008(1)-1008(3) to overlap or be aligned in a same or substantially a same area (see, e.g., areas 1016A(1)-1016A(N)) in the vertical direction (Z-axis direction) with each other to minimize their interconnection distance and associated resistance-capacitance (RC) delay, thus minimizing communication latency and energy overhead. Even if the processing circuits 1006A(1)-1006A(N), 1006B(1)-1006B(N), 1006C(1)-1006C(N) that need to communicate with each other according to the CPU 1002 design do not overlap with each other as disposed in their respective IC tiers 1008(1)-1008(3) the use of the inter-tier interconnects 1012 to couple such processing circuits 1006A(1)-1006A(N), 1006B(1)-1006B(N), 1006C(1)-1006C(N) for a given core 1004A, 1004B, 1004C through the IC tiers 10008(1)-1008(3) may still reduce communication distance, thus improving performance of the CPU 1002.

Thus, the 3DIC 1000 allows tight integration of the processing circuits 1006A(1), 1006B(1), 1006C(1) between cores 1004A, 1004B, 1004B, tight integration of the processing circuits 1006A(2), 1006B(2), 1006C(2) between cores 1004A, 1004B, 1004C, and tight integration of the processing circuits 1006A(N), 1006B(N), 1006C(N) between cores 1004A, 1004B, 1004B, as opposed to 2DICs that do not include multiple stacked dies with vertical interconnect routing therebetween. For example, as shown in FIG. 10, processing circuits 1006A(1), 1006B(1), 1006C(1) may be the same type of circuit for their respective cores 1004A, 1004B, 1004C, processing circuits 1006A(2), 1006B(2), 1006C(2) may be the same type of circuit for their respective cores 1004A, 1004B, 1004C, and processing circuits 1006A(N), 1006B(N), 1006C(N) may be the same type of circuit for their respective cores 1004A, 1004B, 1004C.

Figure 11:
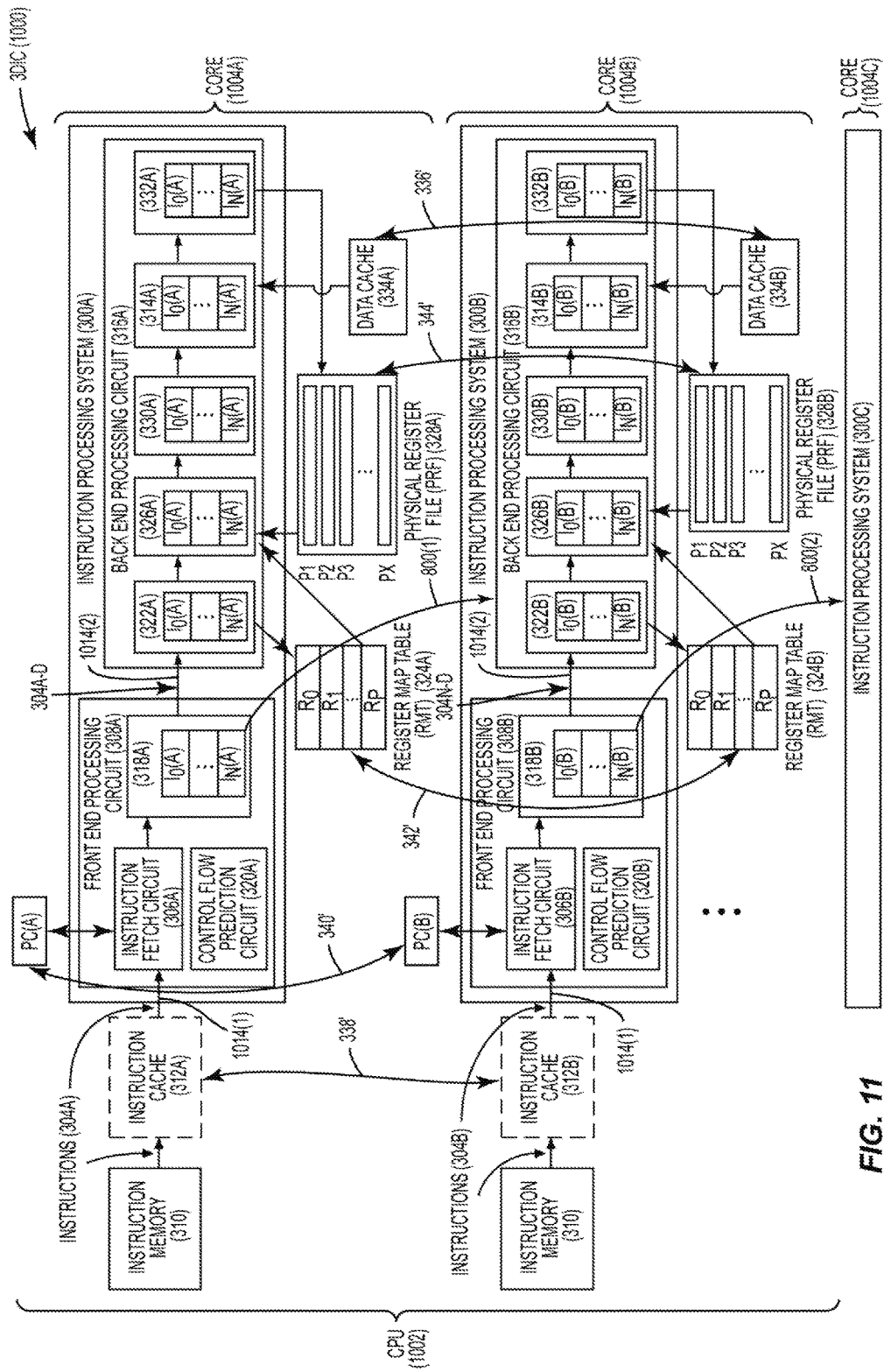
FIG. 11 is a block diagram of exemplary instruction processing systems of the cores in the multi-processor core 3DIC in FIG. 10, and further illustrates the sharing of circuits between the cores through inter-tier and intra-tier communication between the IC tiers in which the cores reside.

FIG. 11 is block diagram of exemplary instruction processing systems that can be provided in the cores 1004A, 1004B, 1004C in the 3DIC 1000 in FIG. 10. FIG. 11 illustrates the instruction processing system 300A in FIG. 3 for core 204A as being the instruction processing system of core 1004A. FIG. 11 also illustrates the instruction processing system 300B in FIG. 3 for core 204B as the instruction processing system of core 1004B. Core 1004C can also include an instruction processing system 300C that is the instruction processing systems 300A, 300B provided in cores 1004A, 1004B. The instruction processing systems 300A-300C are as described in FIG. 3 and thus will not be re-described here. As shown in FIG. 11, taking instruction processing system 300A as an example, the 3DIC 1000 includes the at least one ITV 1014(1) coupling the instruction cache memory 312A to the front end processing circuit 308A, because these circuits may be provided on separate IC tiers 1008(1)-1008(3) in the 3DIC 1000. Further, at least one ITV 1014(2) couples the front end processing circuit 308A to the back end processing circuit 316A, because these circuits may be provided on separate IC tiers 1008(1)-1008(3) in the 3DIC 1000. Thus for example, the core 1004A can pass the decoded instruction 304A-D from the instruction fetch circuit 306A to the rename circuit 322A in the back end processing circuit 318A through the at least one ITV 1014(1). If core fusion is desired, as another example, core 1004A can pass the decoded instruction 304A-D from the instruction fetch circuit 306A of the front end processing circuit 308A to the rename circuit 322B in the back end processing circuit 316B in core 1004B through inter-tier interconnect 338 since the front end processing circuit 308A for core 1004A and the back end processing circuit 316B may also be on different IC tiers 1008(1)-1008(3) in the 3DIC 1000. For example, the back end processing circuit 316B of core 1004B may have greater processing capabilities and throughput than core 1004A. Also, fusion between the cores 1004A, 1004B may be useful to avoid stalls in the front end processing circuit 308A in core 1004A for example, where decoded instructions 304A-D can be provided to the back end processing circuit 316B in core 1004B for processing. Further, the front end processing circuit 308A in core 1004A could also fuse through the ITV 1014(2) with the back end processing circuit 316C in core 1004C. Any core 1004A, 1004B, 1004C and its processing circuits can fuse with any other processing circuits in the other cores 1004A, 1004B, 1004C as needed or desired. For example, cores 1004A, 10004B could be fused, while core 1004C is not fused with either core 1004A, 1004B. As another example, cores 1004B, 1004C could be fused, while core 1004A is not fused with either core 1004B, 1004C. As another example, cores 1004A, 1004C could be fused, while core 1004B is not fused with either core 1004A, 1004C. As another example, all three cores 1004A, 1004B, 1004C could be fused. For example, as discussed above, the front end processing circuit 308A of core 1004A could be fused with both the back end processing circuits 316B, 316C of cores 1004B, 1004C.

Further, with continuing reference to FIG. 10, if the same processing circuits for the cores 1004A, 1004B, 1004B, such as the instruction cache memories 312A, 312B, 312C, the program counter circuits PC(A), PC(B), PC(C), the register map table circuits 324A, 324B, 324C, the physical register file circuits 328A, 328B, 328C, and/or the data cache memories 334A, 334B, 334C as examples, are on the same IC tier 1008(1)-1008(3), intra-tier interconnects 338', 340', 342', 344', 336' may be provided to allow these processing circuits to be shared, as shown in FIG. 11. Further, any of the process thread migration examples discussed above with regard to cores 204A, 204B in FIG. 3 can also be provided as described in FIG. 3 between any combination of the cores 1004A, 1004B, 1004C. Because in this example, the instruction processing systems 300A, 300B in the cores 204A, 204B in FIG. 3 are like the instruction processing systems 300A, 300B, 300C in the cores 1004A, 1004B, 1004C in FIG. 10, such examples will not be re-described and will be well understood to one of ordinary skill.

Figure 12:
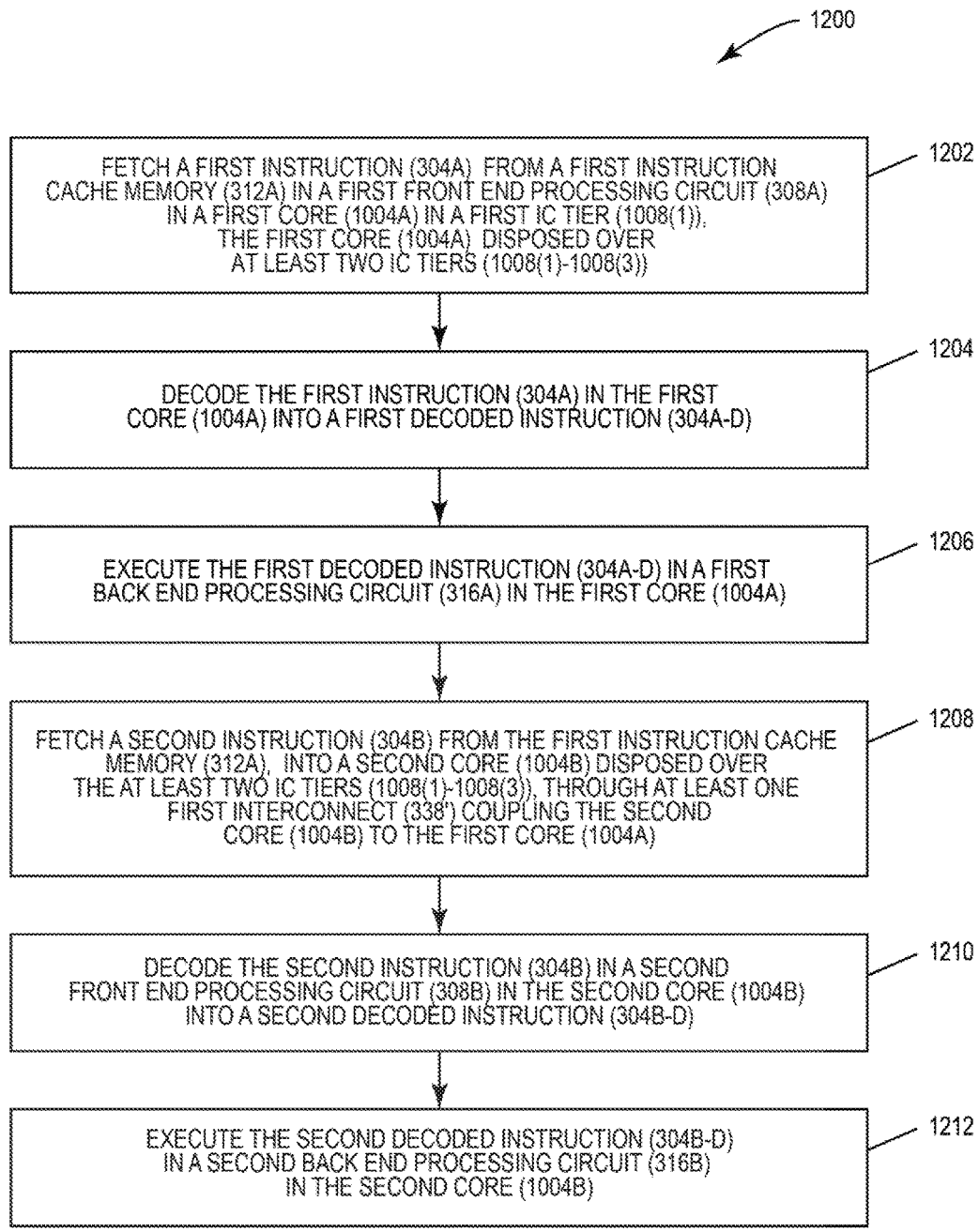
FIG. 12 is a flowchart illustrating an exemplary process of the instruction processing systems of the cores in the multi-processor core 3DIC shown in FIG. 10 communicating with each other to share circuit resources between different cores to optimize performance.

To further illustrate exemplary operation possible in the CPU 1002 in the 3DIC 1000 in FIG. 10, FIG. 12 is provided. FIG. 12 is a flowchart illustrating an exemplary process 1200 of the instruction processing systems 300A, 300B, 300C of the cores 1004A, 1004B, 1004C in the 3DIC 1000 shown in FIG. 10 communicating with each other to share circuit resources between different cores to optimize performance. For example, the instruction fetch circuit 306A in core 1004A can fetch a first instruction 304A from a first instruction cache memory 312A in the front end processing circuit 308A in a core 1004A in a first IC tier 1008(1), the core 1004A disposed over at least two IC tiers 1008(1)-1008 (3) (block 1202). The instruction decode circuit 318A decodes the first instruction 304A in the core 1004A into a decoded instruction 304A-D (block 1204). The execution circuit 314A in the back end processing circuit 316A in the core 1004A will eventually receive and execute the decoded instruction 304A-D (block 1206). The instruction fetch circuit 306B in the front end processing circuit 308B of the core 1004B disposed over the at least two IC tiers 1008(1)-1008(3) may fetch an instruction 304B from the first instruction cache memory 312A through the at least one intra-tier interconnect 338' coupling the core 1004B to the core 1004A (block 1208). The instruction decode circuit 318B in the core 1004B decodes the instruction 304B into a decoded instruction 304B-D (block 1210). The execution circuit 314B in the back end processing circuit 316B in the core 1004B will eventually receive and execute the decoded instruction 304B-D (block 1212). The opposite of the process 1200 in FIG. 12 is also possible wherein the operations discussed therein with regard to core 1004A, 1004B, 1004C and their accessed resources are reversed. The process 1200 in FIG. 12 can also be performed between any of the cores 1004A, 1004B, 1004C.

Figure 13A:
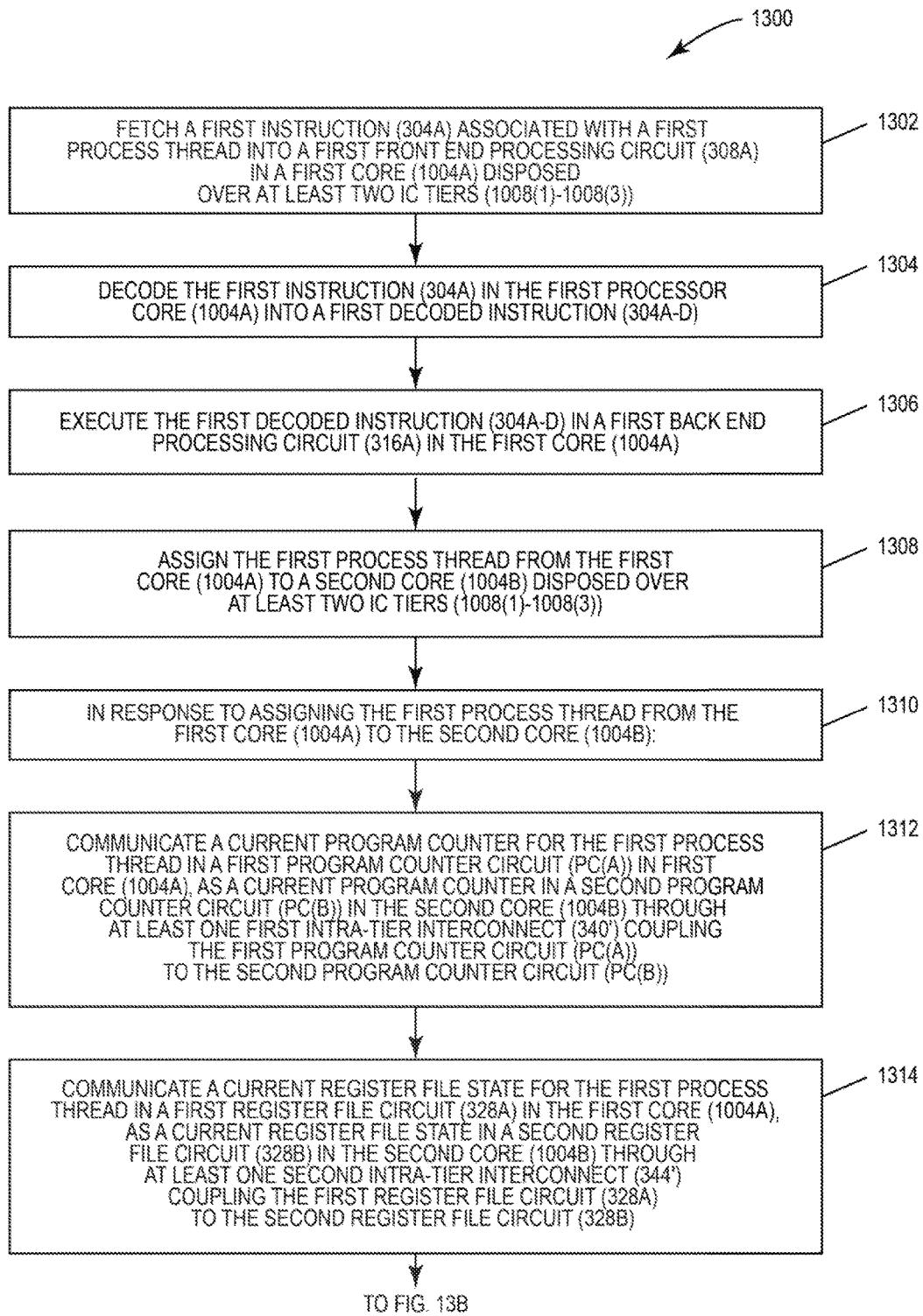
FIGS. 13A and 13B are flowcharts illustrating an exemplary process of process migration between the instruction processing systems of the cores in the multi-processor core 3DIC in FIG. 10 to optimize performance.
Figure 13B:
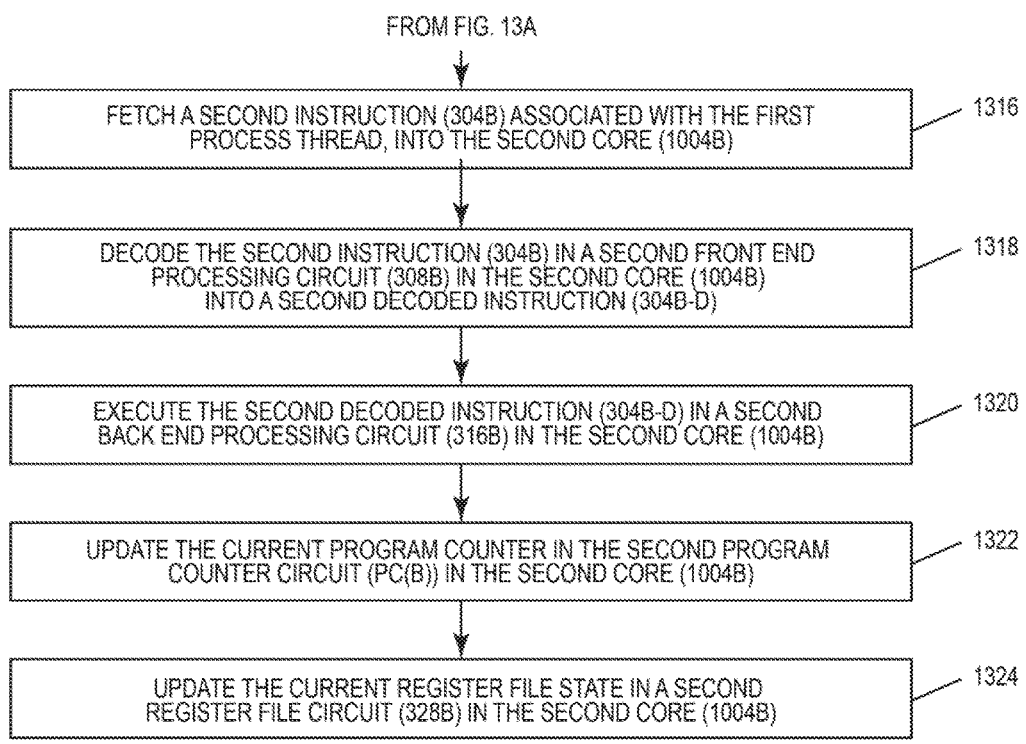

FIGS. 13A and 13B are flowcharts illustrating another exemplary process 1300 of process migration between the instruction processing systems 300A, 300B, 300C of the cores 1004A, 1004B, 1004C in the 3DIC 1000 in FIG. 10 to optimize performance. In this regard, the instruction fetch circuit 306A fetches an instruction 304A associated with a first process thread into the front end processing circuit 308A in the core 1004A disposed over at least two IC tiers 1008(1)-1008(3) (block 1302). The instruction decode circuit 318A decodes the instruction 304A in the core 1004A into a first decoded instruction 304A-D (block 1304). The execution circuit 314A in the back end processing circuit 316A of the core 1004A executes the decoded instruction 304A-D (block 1306). The first process thread is then assigned from the core 1004A to the core 1004B disposed over at least two IC tiers 1008(1)-1008(3) (block 1308). In response to assigning the first process thread from the core 1004A to the core 1004B (block 1310), the instruction processing system 300A communicates a current program counter for the first process thread in the program counter circuit PC(A) in the core 1004A, as a current program counter in the program counter circuit PC(B) in the core 1004B through the at least one first intra-tier interconnect 340' coupling the first program counter circuit PC(A) to the second program counter circuit PC(B) (block 1312). Also in response to assigning the first process thread from the core 1004A to the core 1004B, the instruction processing system 300A communicates a current register file state for the first process thread in the physical register file circuit 328A in the core 1004A, as a current register file state in a physical register file circuit 328B in the core 1004B through at least one second intra-tier interconnect 344' coupling the physical register file circuit 328A to the physical register file circuit 328B (block 1314).

With continuing reference to FIG. 13B, with the migration of the first process thread from the core 1004A to the core 1004B, the instruction fetch circuit 306B in the front end processing circuit 308B of the instruction processing system 300B fetches an instruction 304B associated with a first process thread into the front end processing circuit 308B in the core 1004B (block 1316). The instruction decode circuit 318B decodes the instruction 304B in the core 1004B into a second decoded instruction 304B-D (block 1318). The execution circuit 314B in the back end processing circuit 316B of the core 1004B executes the decoded instruction 304B-D (block 1320). The front end processing circuit 308B updates the current program counter in the program counter circuit PC(B) in the core 1004B (block 1322), and updates the current register file state in a physical register file circuit 328B also in the core 1004B (block 1324).

Figure 14:
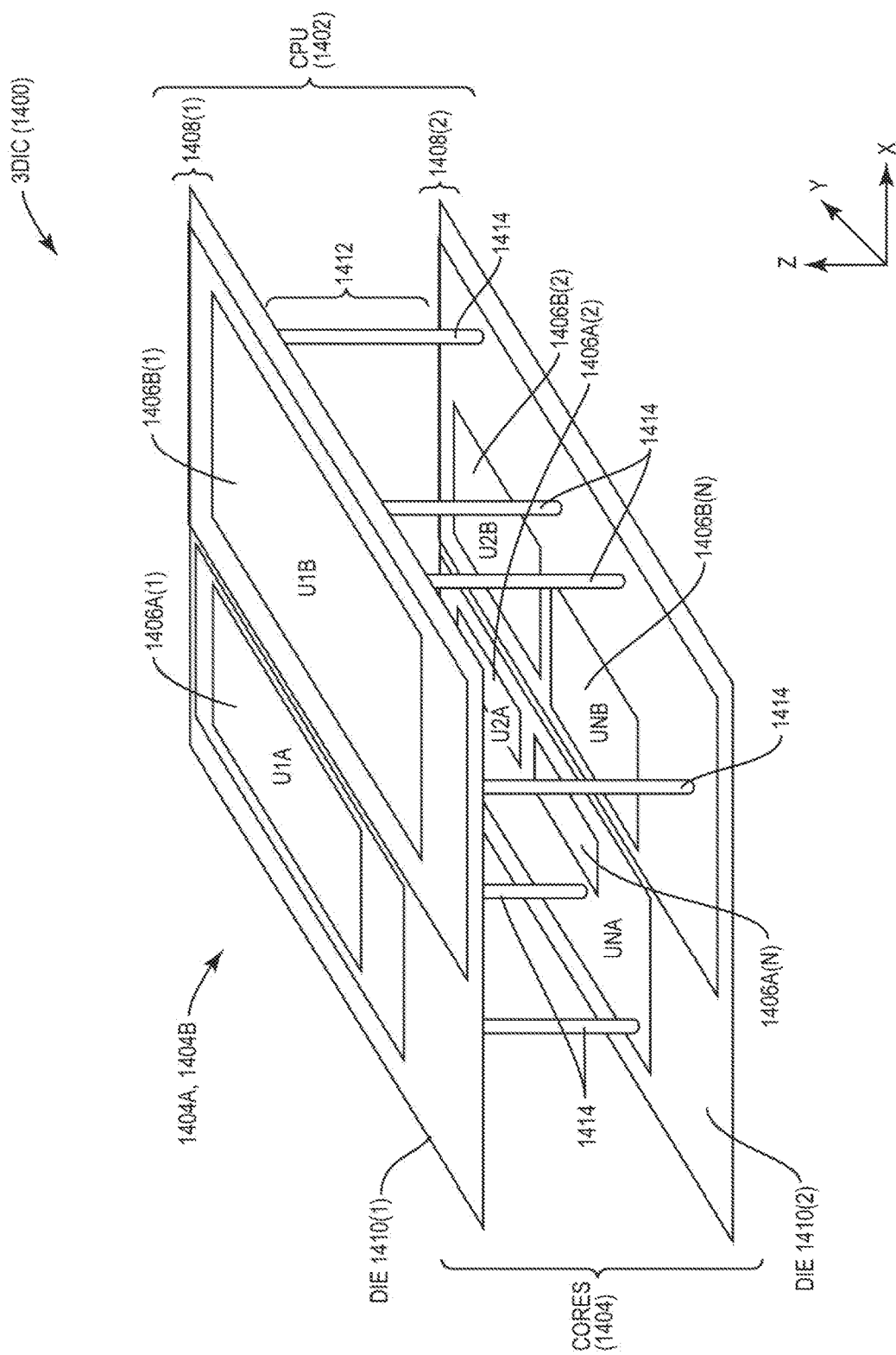
FIG. 14 is another exemplary multi-processor core 3DIC wherein circuits of each core are split among different IC tiers in the 3DIC.

In the 3DIC 1000 in FIG. 10, the same types of processing circuits 1006A(1)-1006A(N), 1006B(1)-1006B(N), 1006C(1)-1006C(N) for different cores 1004A, 1004B, 1004C are located on separate IC tiers 1008(1)-1008(3). It also possible for multiple same types of processing circuits for different cores to reside on the same IC tier. In this regard, FIG. 14 is another exemplary 3DIC 1400 that includes a CPU 1402 wherein processing circuits 1406A(1), 1406B(1) for cores 1404A, 1404B are disposed on a first IC tier 1004(1), and processing circuits 1406A(2), 1406A(N), 1406B(2), 1406B(N) are disposed on a second IC tier 1404(2). The processing circuits 1406A(1)-1406A(N), 1406B(1)-1406B(N) can include any of the processing circuits described above in FIG. 3 for example. In this example, each core 1404A, 1404B is spread over different IC tiers 1408(1)-1408(2). Each IC tier 1408(1)-1408(2) is a die 1410(1)-1410(2) that may include a substrate layer, with a semiconducting or active layer disposed thereon for forming active devices. The dies 1410(1)-1410(2) are stacked on top of each other and overlap each other in the vertical direction, which is the Z-axis direction in FIG. 14.

To provide electrical interconnections between processing circuits 1406A(1), 1406B(1), and processing circuits 1406A(2), 1406A(N), 1406B(2), 1406B(N), inter-tier interconnects 1412 in the form of conductive ITVs 1414 (e.g., TSVs, face-to-face interconnect vias, metal pads) are fabricated in the 3DIC 1400 to electrically couple electrical components between different IC tiers 1408(1)-1408(2). The inter-tier interconnects 1412 allow the respective processing circuits 1406A(1), 1406B(1) for cores 1404A, 1404B, and processing circuits 1406A(2), 1406A(N), 1406B(2), 1406B(N) for cores 1404A, 1404B to communicate across the IC tiers 1008(1)-1008(2) with each other to allow the dies 1410(1)-1410(2) and 3DIC 1400 to act as a single device, which is a CPU 1402 in this example. The examples of the instruction processing systems 300A, 300B in FIG. 3 can be provided as instruction processing systems for the cores 1404A, 1404B in FIG. 14, and thus will not be repeated. All of the previous examples of sharing resources, offloading workload, and/or core fusion can be provided in the CPU 1402 in the 3DIC 1400 in FIG. 14, and thus will not be repeated.

Figure 15:
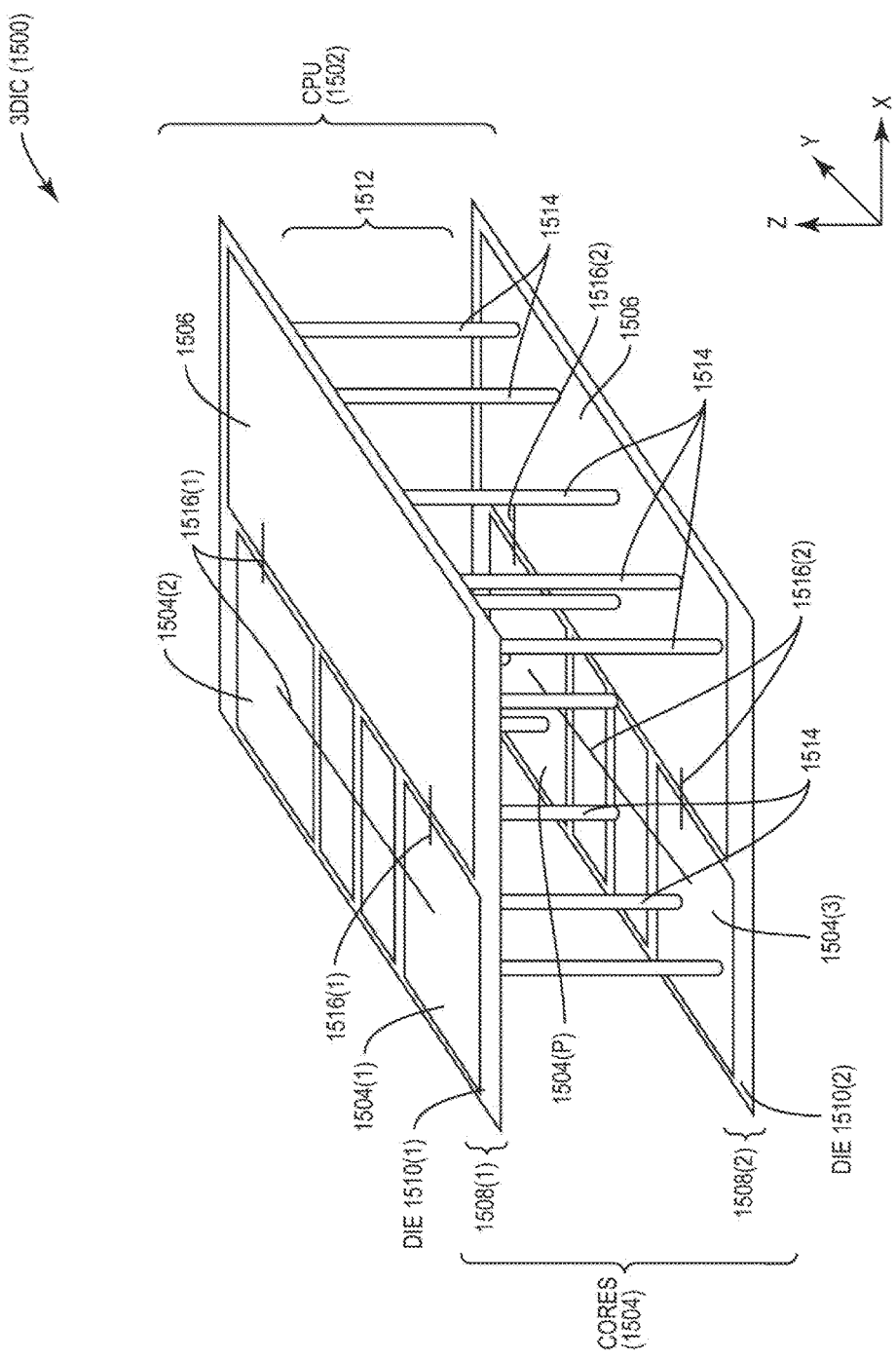
FIG. 15 is another exemplary multi-processor core 3DIC wherein circuits of each core are split among different IC tiers in the 3DIC, and wherein a shared cache memory is spilt among the different IC tiers with each core configured to access the shared cache memory through intra-tier and inter-tier communication.

FIG. 15 is another exemplary 3DIC 1500 wherein processing circuits of each core are split among different IC tiers in the 3DIC 1500, and wherein a shared cache memory is spilt among the different IC tiers with each core configured to access the shared cache memory through intra-tier and inter-tier communication. In this regard, the 3DIC 1500 includes a CPU 1502 that includes multiple cores 1504(1)-1504(P), with cores 1504(1), 1504(2) contained on a same IC tier 1508(1), and cores 1504(3), 1504(P) contained on the different, same IC tier 1508(2). A shared cache memory 1506 is disposed over separate IC tiers 1508(1), 1508(2) in the vertical direction (Z-axis direction). Each IC tier 1508(1), 1508(2) is a die 1510(1), 1510(2) that may include a substrate layer, with semiconducting or active layer disposed thereon for forming active devices. Inter-tier interconnects 1512 in the form of conductive ITVs 1514 (e.g., TSVs, face-to-face interconnect vias, metal pads) are fabricated in the 3DIC 1500 to electrically couple the cores 1504(1), 1504(2) in IC tier 1508(1) to cores 1504(3), 1504(P) in IC tier 1508(2). The inter-tier interconnects 1512 also allow cores 1504(1), 1504(2) in IC tier 1508(1) to be electrically coupled to shared cache memory 1506 in IC tier 1508(2), and cores 1504(3), 1504(P) in IC tier 1508(2) to be electrically coupled to shared cache memory 1506 in IC tier 1508(1). Thus, the cores 1504(1)-1504(P) can access the shared cache memory 1506 through the intra-tier interconnects 1516(1), 1516(2) as shown in FIG. 15 to minimize access latency and energy overhead. The cores 1504(1), 1504(2) being on the same IC tier 1508(1), and the cores 1504(3), 1504(P) being on the same IC tier 1508(2), can communicate with each other, such as for resource sharing for work offloading, process migration, and/or core fusion through respective intra-tier interconnects 1516(1), 1516(2), which may be metal lines in metal layers disposed above an active semiconducting layer in the IC tier 1508(1). All of the previous examples of resource sharing for work offloading, process migration, and/or core fusion discussed above are equally applicable between the cores 1504(1)-1504(P) in the 3DIC 1500 in FIG. 15. Further note that the cores 1504(1)-1504(P) may be homogeneous cores, meaning that the cores are designed the same, with a same or substantially a same capacities and performance, or heterogeneous cores, meaning that the cores are designed with different capacities and performance. For example, heterogeneous cores are designed to exhibit different power and performance characteristics to mitigate conflicting demands between performance and power efficiency.

In other aspects, a method of communicating information between processor cores in a 3DIC is provided. The method comprises fetching a first instruction from a first instruction cache memory in a first front end processing circuit in a first processor core in a first IC tier. The method also comprises decoding the first instruction in the first processor core into a first decoded instruction. The method also comprises executing the first decoded instruction in a first back end processing circuit in the first processor core. The method also comprises fetching a second instruction from the first instruction cache memory, into a second processor core through at least one first inter-tier interconnect coupling the second processor core in a second IC tier to the first instruction cache memory in the first IC tier. The method also comprises decoding the second instruction in a second front end processing circuit in the second processor core into a second decoded instruction. The method also comprises executing the second decoded instruction in a second back end processing circuit in the second processor core.

The method may also comprise fetching a third instruction from a second instruction cache memory in the second front end processing circuit in the second processor core in the second IC tier, decoding the third instruction in the second front end processing circuit in the second processor core into a third decoded instruction, executing the third decoded instruction in the second back end processing circuit in the second processor core, fetching a fourth instruction from the second instruction cache memory, into the first front end processing circuit in the first processor core through at least one second inter-tier interconnect coupling the first processor core in the first IC tier to the second instruction cache memory in the second IC tier, decoding the fourth instruction in the first front end processing circuit in the first processor core into a fourth decoded instruction, and executing the fourth decoded instruction in the first back end processing circuit in the first processor core.

The method may also further comprise communicating information regarding the first decoded instruction from the first front end processing circuit to the second back end processing circuit over at least one third inter-tier interconnect coupling the first front end processing circuit to the second back end processing circuit, and executing the first decoded instruction in the second back end processing circuit in the second processor core based on the information regarding the first decoded instruction. Communicating the information regarding the first decoded instruction may comprise communicating the information regarding the first decoded instruction from the first front end processing circuit to a second register rename circuit in the second back end processing circuit over the at least one third inter-tier interconnect coupling the first front end processing circuit to the second back end processing circuit.

The method also further comprises renaming a register in the first decoded instruction in the second register rename circuit to provide a renamed register for the first decoded instruction, wherein executing the first decoded instruction in the second back end processing circuit comprises executing the first decoded instruction in the second back end processing circuit in the second processor core based on the information regarding the first decoded instruction and information regarding the renamed register.

In another aspect, a method of communicating information between processor cores in a 3DIC is provided. The method comprises fetching a first instruction associated with a first process thread into a first front end processing circuit in a first processor core in a first IC tier. The method also comprises decoding the first instruction in the first processor core into a first decoded instruction. The method also comprises executing the first decoded instruction in a first back end processing circuit in the first processor core. The method also comprises assigning the first process thread from the first processor core to a second processor core in a second IC tier different from the first IC tier. In response to assigning the first process thread from the first processor core to the second processor core, the method may also comprise communicating a current program counter for the first process thread in a first program counter circuit in the first processor core, as a current program counter in a second program counter circuit in the second processor core through at least one first inter-tier interconnect coupling the first program counter circuit in the first IC tier to the second program counter circuit in the second IC tier, communicating a current register file state for the first process thread in a first register file circuit in the first processor core, as a current register file state in a second register file circuit in the second processor core through at least one second inter-tier interconnect coupling the first register file circuit in the first IC tier to the second register file circuit in the second IC tier, fetching a second instruction associated with the first process thread into the second processor core, decoding the second instruction in a second front end processing circuit in the second processor core into a second decoded instruction, executing the second decoded instruction in a second back end processing circuit in the second processor core, updating the current program counter in the second program counter circuit in the second processor core, and updating the current register file state in the second register file circuit in the second processor core.

The method may also further comprise fetching a third instruction associated with a second process thread into the second front end processing circuit in the second processor core, decoding the third instruction in the second processor core into the second decoded instruction, executing the second decoded instruction in the second back end processing circuit in the second processor core, assigning the second process thread from the second processor core to the first processor core. In response to assigning the second process thread from the second processor core to the first processor core, the method may comprise communicating a current program counter for the second process thread in the second program counter circuit in the second processor core, as the current program counter in the first program counter circuit in the first processor core through the at least one first inter-tier interconnect coupling the first program counter circuit to the second program counter circuit, communicating a current register file state for the second process thread in the second register file circuit in the second processor core, as the current register file state in the first register file circuit in the first processor core through the at least one second inter-tier interconnect coupling the first register file circuit to the second register file circuit, fetching a fourth instruction associated with the second process thread into the first processor core, decoding the fourth instruction in the first front end processing circuit in the first processor core into a fourth decoded instruction, executing the fourth decoded instruction in the first back end processing circuit in the first processor core, updating the current program counter in the first program counter circuit in the first processor core, and updating the current register file state in the first register file circuit in the first processor core.

The method may also further comprise communicating information regarding the first decoded instruction from the first front end processing circuit to the second back end processing circuit over at least one third inter-tier interconnect coupling the first front end processing circuit to the second back end processing circuit, and executing the first decoded instruction in the second back end processing circuit in the second processor core based on the information regarding the first decoded instruction.

The method may also provide that communicating the information regarding the first decoded instruction comprises communicating the information regarding the first decoded instruction from the first front end processing circuit to a second register rename circuit in the second back end processing circuit over the at least one third inter-tier interconnect coupling the first front end processing circuit to the second back end processing circuit. The method may also further comprise renaming a register in the first decoded instruction in the second register rename circuit to provide a renamed register for the first decoded instruction, wherein executing the first decoded instruction in the second back end processing circuit comprises executing the first decoded instruction in the second back end processing circuit in the second processor core based on the information regarding the first decoded instruction and information regarding the renamed register.

In another aspect, a method of communicating information between processor cores in a 3DIC is provided. The method comprises fetching a first instruction from a first instruction cache memory in a first front end processing circuit in a first processor core in a first IC tier, wherein the first processor core is disposed over at least two IC tiers. The method also comprises decoding the first instruction in the first processor core into a first decoded instruction. The method also comprises executing the first decoded instruction in a first back end processing circuit in the first processor core. The method also comprises fetching a second instruction from the first instruction cache memory, into a second processor core disposed over the at least two IC tiers, through at least one first interconnect coupling the second processor core to the first processor core. The method also comprises decoding the second instruction in a second front end processing circuit in the second processor core into a second decoded instruction. The method also comprises executing the second decoded instruction in a second back end processing circuit in the second processor core.

The method may also comprise fetching the second instruction from the first instruction cache memory, into the second processor core disposed over the at least two IC tiers, through at least one first inter-tier interconnect coupling the second processor core to the first processor core.

The method may also comprise fetching the second instruction from the first instruction cache memory, into the second processor core disposed over the at least two IC tiers, through at least one first intra-tier interconnect coupling the second processor core to the first processor core.

The method may also further comprise communicating information regarding the first decoded instruction from the first front end processing circuit to the second back end processing circuit over at least one third interconnect coupling the first front end processing circuit to the second back end processing circuit, and executing the first decoded instruction in the second back end processing circuit in the second processor core based on the information regarding the first decoded instruction.

The method can also involve that communicating the information regarding the first decoded instruction comprises communicating the information regarding the first decoded instruction from the first front end processing circuit to a second register rename circuit in the second back end processing circuit over the at least one third interconnect coupling the first front end processing circuit to the second back end processing circuit. The method may further comprise renaming a register in the first decoded instruction in the second register rename circuit to provide a renamed register for the first decoded instruction, wherein executing the first decoded instruction in the second back end processing circuit comprises executing the first decoded instruction in the second back end processing circuit in the second processor core based on the information regarding the first decoded instruction and information regarding the renamed register.

In another aspect, a method of communicating information between processor cores in a 3DIC is provided. The method comprises fetching a first instruction associated with a first process thread into a first front end processing circuit in a first processor core disposed over at least two IC tiers. The method also comprises decoding the first instruction in the first processor core into a first decoded instruction. The method also comprises executing the first decoded instruction in a first back end processing circuit in the first processor core. The method also comprises assigning the first process thread from the first processor core to a second processor core disposed over the at least two IC tiers. In response to assigning the first process thread from the first processor core to the second processor core, the method may also comprise communicating a current program counter for the first process thread in a first program counter circuit in the first processor core, as a current program counter in a second program counter circuit in the second processor core through at least one first interconnect coupling the first program counter circuit to the second program counter circuit, communicating a current register file state for the first process thread in a first register file circuit in the first processor core, as a current register file state in a second register file circuit in the second processor core through at least one second interconnect coupling the first register file circuit to the second register file circuit, fetching a second instruction associated with the first process thread into the second processor core, decoding the second instruction in a second front end processing circuit in the second processor core into a second decoded instruction, executing the second decoded instruction in a second back end processing circuit in the second processor core, updating the current program counter in the second program counter circuit in the second processor core, and updating the current register file state in the second register file circuit in the second processor core.

The method may also comprise communicating the current program counter for the first process thread in the first program counter circuit in the first processor core, as the current program counter in the second program counter circuit in the second processor core through at least one first inter-tier interconnect coupling the first program counter circuit to the second program counter circuit. The method may also comprise communicating the current register file state for the first process thread in the first register file circuit in the first processor core, as the current register file state in the second register file in the second processor core through at least one second inter-tier interconnect coupling the first register file circuit to the second register file circuit.

The method may also comprise communicating the current program counter for the first process thread in the first program counter circuit in the first processor core, as the current program counter in the second program counter circuit in the second processor core through at least one first intra-tier interconnect coupling the first program counter circuit to the second program counter circuit, and communicating the current register file state for the first process thread in the first register file circuit in the first processor core, as the current register file state in the second register file circuit in the second processor core through at least one second intra-tier interconnect coupling the first register file circuit to the second register file circuit.

The method may also comprise communicating information regarding the first decoded instruction from the first front end processing circuit to the second back end processing circuit over at least one third interconnect coupling the first front end processing circuit to the second back end processing circuit, and executing the first decoded instruction in the second back end processing circuit in the second processor core based on the information regarding the first decoded instruction.

The method may also provide that communicating the information regarding the first decoded instruction comprises communicating the information regarding the first decoded instruction from the first front end processing circuit to a second register rename circuit in the second back end processing circuit over the at least one third interconnect coupling the first front end processing circuit to the second back end processing circuit. The method may further comprise renaming a register in the first decoded instruction in the second register rename circuit to provide a renamed register for the first decoded instruction, wherein executing the first decoded instruction in the second back end processing circuit comprises executing the first decoded instruction in the second back end processing circuit in the second processor core based on the information regarding the first decoded instruction and information regarding the renamed register.

Multi-processor core 3DICs, such as the multi-processor core 3DICs 200, 700, 900, 1000, 1400, and 1500 in FIGS. 2, 7, 9, 10, 14, and 15, for example, may be provided in or integrated into any processor-based device. Examples, without limitation, include a set top box, an entertainment unit, a navigation device, a communication device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 16:
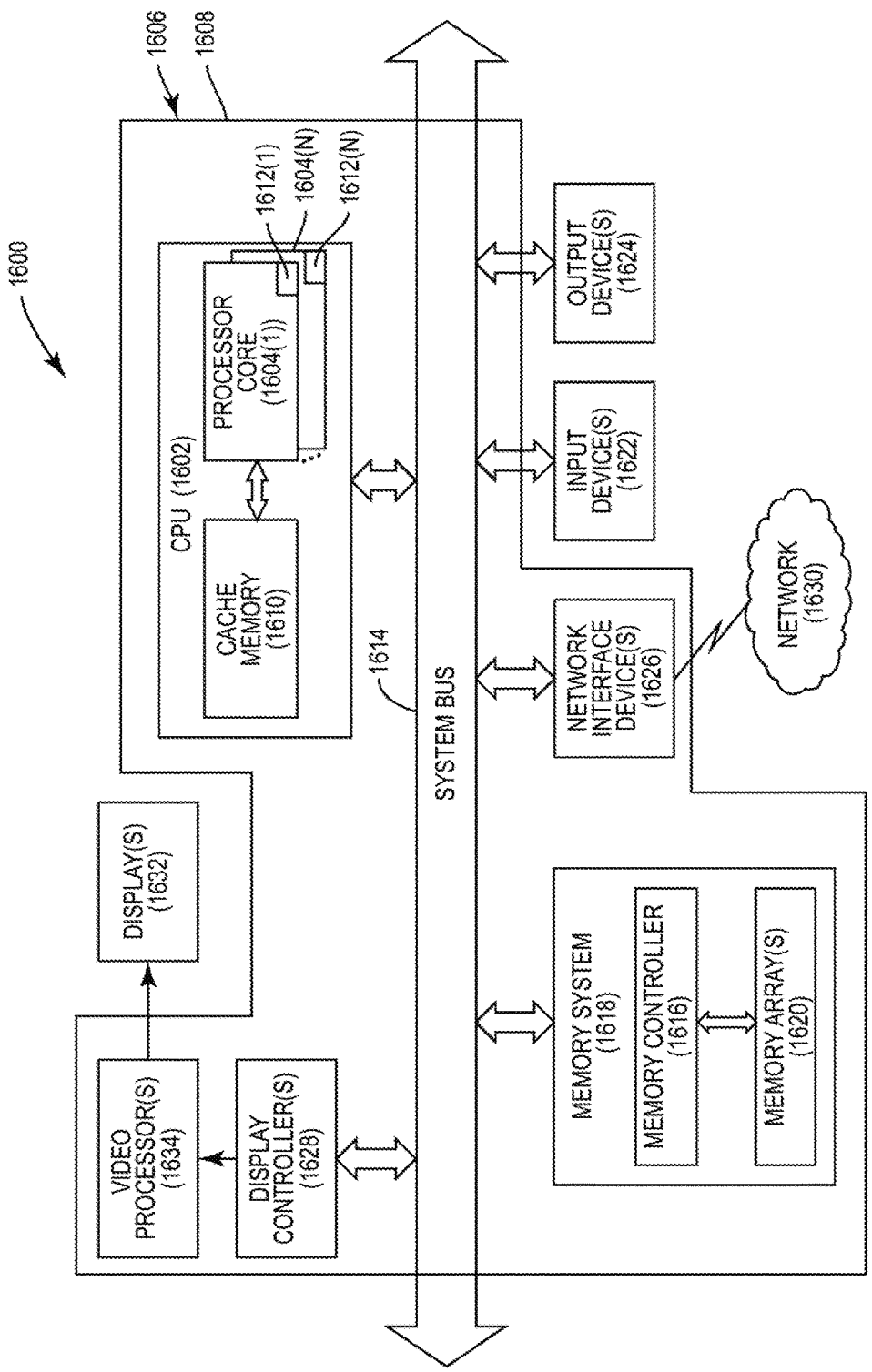
FIG. 16 is a block diagram of an exemplary processor-based system that includes a central processing unit (CPU) that includes a multi-core 3DIC.

In this regard, FIG. 16 is a block diagram of an exemplary processor-based system 1600 that can be provided as multi-processor core 3DICs that includes multiple processor cores dispersed within different IC tiers, including but not limiting to the multi-processor core 3DICs 200, 700, 900, 1000, 1400, and 1500 in FIGS. 2, 7, 9, 10, 14, and 15. In this example, the processor-based system 1600 includes a central processing unit (CPU) 1602 that includes multiple processor cores 1604(1)-1604(N). The processor-based system 1602 may be provided as a system-on-a-chip (SoC) 1606 as part of a 3DIC 1608. The CPU 1602 may include a shared cache memory 1610 accessible by each of the processor cores 1604(1)-1604(N) for rapid access to temporarily stored data. Each of the processor cores 1604(1)-1604(N) may also have a private cache memory 1612(1)-1612(N). The CPU 1602 is coupled to a system bus 1614 and can intercouple master and slave devices included in the processor-based system 1600. As is well known, the CPU 1602 communicates with these other devices by exchanging address, control, and data information over the system bus 1614. For example, the CPU 1602 can communicate bus transaction requests to a memory controller 1616 in a memory system 1618 as an example of a slave device. Although not illustrated in FIG. 16, multiple system buses 1614 could be provided, wherein each system bus 1614 constitutes a different fabric. In this example, the memory controller 1616 is configured to provide memory access requests to one or more memory arrays 1620 in the memory system 1618.

Other devices can be connected to the system bus 1614. As illustrated in FIG. 16, these devices can include the memory system 1618, one or more input devices 1622, one or more output devices 1624, one or more network interface devices 1626, and one or more display controllers 1628, as examples. The input device(s) 1622 can include any type of input device, including but not limited to input keys, switches, voice processors, etc. The output device(s) 1624 can include any type of output device, including but not limited to audio, video, other visual indicators, etc. The network interface device(s) 1626 can be any devices configured to allow exchange of data to and from a network 1630. The network 1630 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1626 can be configured to support any type of communication protocol desired.

The CPU 1602 may also be configured to access the display controller(s) 1628 over the system bus 1614 to control information sent to one or more displays 1632. The display controller(s) 1628 sends information to the display(s) 1632 to be displayed via one or more video processors 1634, which process the information to be displayed into a format suitable for the display(s) 1632. The display(s) 1632 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) integrated circuit (IC) (3DIC), comprising:
    a first IC tier comprising a first processor core comprising a plurality of first processing circuits comprising:
        a first front end processing circuit comprising a first instruction fetch circuit coupled to a first instruction cache memory; and
        a first back end processing circuit comprising a first execution circuit coupled to the first front end processing circuit;
    a second IC tier different from the first IC tier, the second IC tier comprising a second processor core comprising a plurality of second processing circuits comprising:
        a second front end processing circuit comprising a second instruction fetch circuit coupled to a second instruction cache memory; and
        a second back end processing circuit comprising a second execution circuit coupled to the second front end processing circuit; and
    at least one first inter-tier interconnect coupling a first processing circuit of the plurality of first processing circuits in the first processor core in the first IC tier, to the second instruction cache memory in the second IC tier; and
    at least one second inter-tier interconnect coupling the first front end processing circuit to the second back end processing circuit.

2. The 3DIC of claim 1, wherein:
    the first instruction fetch circuit is configured to fetch first instructions from the first instruction cache memory;
    the first execution circuit is configured to execute the first instructions;
    the second instruction fetch circuit is configured to fetch second instructions from the second instruction cache memory; and the second execution circuit is configured to execute the second instructions.

3. The 3DIC of claim 1, wherein the plurality of first processing circuits further comprises the first instruction cache memory configured to store first instructions; and
further comprising at least one third inter-tier interconnect coupling a second processing circuit of the plurality of second processing circuits in the second processor core in the second IC tier, to the first instruction cache memory in the first IC tier.

4. The 3DIC of claim 3, wherein:
the first instruction cache memory is disposed in a first area of the first IC tier; and
the second instruction cache memory is disposed in a second area of the second IC tier, wherein the second area overlaps vertically with the first area.

5. The 3DIC of claim 1, wherein:
the first processor core comprises a first instruction pipeline comprising the plurality of first processing circuits; and
the second processor core comprises a second instruction pipeline comprising the plurality of second processing circuits.

6. The 3DIC of claim 5, wherein:
the first front end processing circuit further comprises a first instruction decode circuit configured to decode first instructions;
the first back end processing circuit further comprises a first register rename circuit configured to rename registers in the first instructions;
the second front end processing circuit further comprises a second instruction decode circuit configured to decode second instructions;
the second back end processing circuit further comprises a second register rename circuit configured to rename registers in the second instructions; and
the at least one second inter-tier interconnect couples the first instruction decode circuit to the second register rename circuit.

7. The 3DIC of claim 1, wherein:
the first processor core comprises a first out-of-order processor (OoP) core; and
the second processor core comprises a second OoP core.

8. The 3DIC of claim 1, further comprising:
a third IC tier comprising a third processor core comprising a plurality of third processing circuits comprising:
a third instruction cache memory configured to store third instructions;
a third front end processing circuit comprising a third instruction fetch circuit coupled to the third instruction cache memory; and
a third back end processing circuit comprising a third execution circuit coupled to the third front end processing circuit and configured to execute the third instructions; and
at least one third inter-tier interconnect coupling the first processing circuit of the plurality of first processing circuits in the first processor core in the first IC tier, to the third instruction cache memory in the third IC tier.

9. The 3DIC of claim 1 integrated into a system-on-a-chip (SoC).

10. The 3DIC of claim 1 integrated into a device selected from the group consisting of: a set top box; an entertainment unit; a navigation device; a communication device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A three-dimensional (3D) integrated circuit (IC) (3DIC), comprising:
a first IC tier comprising a first processor core comprising a plurality of first processing circuits comprising:
a first architectural state circuit comprising a first program counter circuit and a first register file circuit comprising a plurality of first registers;
a first front end processing circuit comprising a first instruction fetch circuit configured to fetch first instructions from a first instruction memory; and
a first back end processing circuit comprising a first execution circuit coupled to the first front end processing circuit and configured to execute the first instructions;
a second IC tier different from the first IC tier, the second IC tier comprising a second processor core comprising a plurality of second processing circuits comprising:
a second architectural state circuit comprising a second program counter circuit and a second register file circuit comprising a plurality of second registers;
a second front end processing circuit comprising a second instruction fetch circuit configured to fetch second instructions from a second instruction memory; and
a second back end processing circuit comprising a second execution circuit coupled to the second front end processing circuit and configured to execute the second instructions; and
at least one first inter-tier interconnect coupling a first processing circuit of the plurality of first processing circuits in the first processor core in the first IC tier, to the second architectural state circuit in the second IC tier.

12. The 3DIC of claim 11, wherein:
the first instruction fetch circuit is configured to fetch the first instructions from the first instruction memory;
the first execution circuit is configured to execute the first instructions;
the second instruction fetch circuit is configured to fetch the second instructions from the second instruction memory; and
the second execution circuit is configured to execute the second instructions.

13. The 3DIC of claim 11, further comprising at least one second inter-tier interconnect coupling a second processing circuit of the plurality of second processing circuits in the second processor core in the second IC tier, to the first architectural state circuit in the first IC tier.

14. The 3DIC of claim 11, wherein:
the first processor core comprises a first instruction pipeline comprising the plurality of first processing circuits; and
the second processor core comprises a second instruction pipeline comprising the plurality of second processing circuits.

15. The 3DIC of claim 14, further comprising at least one second inter-tier interconnect coupling the first front end processing circuit to the second back end processing circuit.

16. The 3DIC of claim 15, wherein:
the first front end processing circuit further comprises a first instruction decode circuit configured to decode the first instructions;
the first back end processing circuit further comprises a first register rename circuit configured to rename registers in the first instructions;
the second front end processing circuit further comprises a second instruction decode circuit configured to decode the second instructions;
the second back end processing circuit further comprises a second register rename circuit configured to rename registers in the second instructions; and
the at least one second inter-tier interconnect couples the first instruction decode circuit to the second register rename circuit.

17. The 3DIC of claim 11, wherein:
the first processor core comprises a first out-of-order processor (OoP) core; and
the second processor core comprises a second OoP core.

18. The 3DIC of claim 11, wherein:
at least one of the first program counter circuit, the first register file circuit, and the first architectural state circuit is disposed in a first area of the first IC tier; and
at least one of the second program counter circuit, the second register file circuit, and the second architectural state circuit is disposed in a second area of the second IC tier, wherein the second area overlaps vertically with the first area.

19. The 3DIC of claim 11, further comprising:
a third IC tier comprising a third processor core comprising a plurality of third processing circuits comprising:
a third architectural state circuit comprising a third program counter circuit and a third register file circuit comprising a plurality of third registers;
a third front end processing circuit comprising a third instruction fetch circuit configured to fetch third instructions from a third instruction memory; and
a third back end processing circuit comprising a third execution circuit coupled to the third front end processing circuit and configured to execute the third instructions; and
at least one third inter-tier interconnect coupling the first processing circuit of the plurality of first processing circuits in the first processor core in the first IC tier, to the third architectural state circuit in the third IC tier.

20. The 3DIC of claim 11 integrated into a system-on-a-chip (SoC).

21. The 3DIC of claim 11 integrated into a device selected from the group consisting of: a set top box; an entertainment unit; a navigation device; a communication device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

22. A three-dimensional (3D) integrated circuit (IC) (3DIC), comprising:
a first processor core comprising a plurality of first processing circuits configured to process first instructions, the plurality of first processing circuits disposed over at least two IC tiers, the plurality of first processing circuits comprising:
a first front end processing circuit configured to decode the first instructions into first decoded instructions; and
a first back end processing circuit coupled to the first front end processing circuit and configured to execute the first decoded instructions;
a second processor core comprising a plurality of second processing circuits configured to process second instructions, the plurality of second processing circuits disposed over the at least two IC tiers, the plurality of second processing circuits comprising:
a second front end processing circuit configured to decode the second instructions into second decoded instructions; and
a second back end processing circuit coupled to the second front end processing circuit and configured to execute the second decoded instructions; and
at least one first inter-tier interconnect coupling at least one first processing circuit of the plurality of first processing circuits in a first IC tier of the at least two IC tiers and at least one second processing circuit of the plurality of second processing circuits in a second IC tier of the at least two IC tiers.

23. The 3DIC of claim 22, wherein:
the first front end processing circuit is configured to fetch the first instructions from a first instruction cache memory; and
the second front end processing circuit is configured to fetch the second instructions from a second instruction cache memory.

24. The 3DIC of claim 22, wherein:
the plurality of first processing circuits further comprises:
a first instruction memory configured to store the first instructions to be executed; and
a first register file circuit comprising a plurality of first registers; and
the plurality of second processing circuits further comprises:
a second instruction memory configured to store the second instructions to be executed; and
a second register file circuit comprising a plurality of second registers.

25. The 3DIC of claim 22, further comprising at least one second inter-tier interconnect coupling the at least one second processing circuit of the plurality of second processing circuits in the second IC tier of the at least two IC tiers and at least one first processing circuit of the plurality of first processing circuits in the first IC tier of the at least two IC tiers.

26. The 3DIC of claim 22, wherein:
the first processor core comprises a first instruction pipeline comprising the plurality of first processing circuits; and
the second processor core comprises a second instruction pipeline comprising the plurality of second processing circuits.

27. The 3DIC of claim 26, further comprising at least one second inter-tier interconnect coupling the first front end processing circuit to the second back end processing circuit.

28. The 3DIC of claim 27, wherein:
the first front end processing circuit further comprises a first instruction decode circuit configured to decode the first instructions;

the first back end processing circuit further comprises a first register rename circuit configured to rename registers in the first instructions;
the second front end processing circuit further comprises a second instruction decode circuit configured to decode the second instructions;
the second back end processing circuit further comprises a second register rename circuit configured to rename registers in the second instructions; and
the at least one second inter-tier interconnect couples the first instruction decode circuit to the second register rename circuit.

29. The 3DIC of claim 22, wherein:
the first processor core comprises a first out-of-order processor (OoP) core; and
the second processor core comprises a second OoP core.

30. The 3DIC of claim 22, further comprising:
a third processor core comprising a plurality of third processing circuits configured to process third instructions, the plurality of third processing circuits disposed over the at least two IC tiers, the plurality of third processing circuits comprising:
  a third front end processing circuit configured to decode the third instructions into third decoded instructions; and
  a third back end processing circuit coupled to the third front end processing circuit and configured to execute the third decoded instructions; and
at least one third inter-tier interconnect coupling the at least one first processing circuit of the plurality of first processing circuits in the first IC tier of the at least two IC tiers and at least one third processing circuit of the plurality of third processing circuits in a third IC tier of the at least two IC tiers.

31. The 3DIC of claim 30, further comprising at least one fourth inter-tier interconnect coupling the at least one second processing circuit of the plurality of second processing circuits in the second IC tier of the at least two IC tiers and the at least one third processing circuit of the plurality of third processing circuits in a fourth IC tier of the at least two IC tiers.

32. The 3DIC of claim 22, further comprising at least one first intra-tier interconnect coupling the at least one first processing circuit of the plurality of first processing circuits in the first IC tier of the at least two IC tiers and the at least one second processing circuit of the plurality of second processing circuits in the second IC tier of the at least two IC tiers.

33. The 3DIC of claim 30, further comprising at least one second intra-tier interconnect coupling the at least one first processing circuit of the plurality of first processing circuits in the first IC tier of the at least two IC tiers and the at least one third processing circuit of the plurality of third processing circuits in the third IC tier of the at least two IC tiers.

34. The 3DIC of claim 22, wherein:
the plurality of first processing circuits further comprises a first instruction cache memory configured to store the first instructions;
the plurality of second processing circuits further comprises a second instruction cache memory configured to store the second instructions; and
the at least one first inter-tier interconnect couples a first processing circuit of the plurality of first processing circuits in the first processor core, to the second instruction cache memory in the second processor core.

35. The 3DIC of claim 22, wherein:
the plurality of first processing circuits further comprises a first architectural state circuit comprising a first program counter circuit and a first register file circuit comprising a plurality of first registers;
the plurality of second processing circuits further comprises a second architectural state circuit comprising a second program counter circuit and a second register file circuit comprising a plurality of second registers; and
the at least one first inter-tier interconnect couples a first processing circuit of the plurality of first processing circuits in the first processor core in the first IC tier, to the second architectural state circuit in the second IC tier.

36. The 3DIC of claim 22 integrated into a system-on-a-chip (SoC).

37. The 3DIC of claim 22 integrated into a device selected from the group consisting of: a set top box; an entertainment unit; a navigation device; a communication device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *